(12) United States Patent
Adachi et al.

(10) Patent No.: US 9,780,530 B2
(45) Date of Patent: Oct. 3, 2017

(54) SEMICONDUCTOR INTEGRATED OPTICAL DEVICE, MANUFACTURING METHOD THEREOF AND OPTICAL MODULE

(71) Applicant: Oclaro Japan, Inc., Kanagawa (JP)

(72) Inventors: Koichiro Adachi, Tokyo (JP); Takanori Suzuki, Tokyo (JP); Yasushi Sakuma, Tokyo (JP); Kazuhiko Naoe, Kanagawa (JP); Akira Nakanishi, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 69 days.

(21) Appl. No.: 14/961,984

(22) Filed: Dec. 8, 2015

(65) Prior Publication Data

US 2016/0164257 A1    Jun. 9, 2016

(30) Foreign Application Priority Data

Dec. 9, 2014    (JP) .................................. 2014-248981

(51) Int. Cl.
| | |
|---|---|
| *G02B 6/12* | (2006.01) |
| *H01S 5/12* | (2006.01) |
| *H01S 5/20* | (2006.01) |
| *H01S 5/125* | (2006.01) |
| *H01S 5/026* | (2006.01) |
| *H01S 5/028* | (2006.01) |

(Continued)

(52) U.S. Cl.
CPC ............ *H01S 5/1231* (2013.01); *H01S 5/209* (2013.01); *H01S 5/0267* (2013.01); *H01S 5/0287* (2013.01); *H01S 5/125* (2013.01); *H01S 5/22* (2013.01); *H01S 5/2275* (2013.01)

(58) Field of Classification Search
CPC . H01S 5/125; H01S 5/209; H01S 5/12; H01S 5/0265
See application file for complete search history.

(56) References Cited

U.S. PATENT DOCUMENTS

| | | |
|---|---|---|
| 2008/0266638 A1 | 10/2008 | Shinoda et al. |
| 2008/0317422 A1 | 12/2008 | Kitatani et al. |

(Continued)

FOREIGN PATENT DOCUMENTS

| | | |
|---|---|---|
| JP | 2008-277445 A | 11/2008 |
| JP | 2009-004488 A | 1/2009 |

(Continued)

*Primary Examiner* — Sung Pak
*Assistant Examiner* — Hoang Tran
(74) *Attorney, Agent, or Firm* — Mattingly & Malur, PC

(57) ABSTRACT

Provided is a butt-jointed (BJ) semiconductor integrated optical device having a high manufacturing yield. A semiconductor integrated optical device, which is configured such that, on a semiconductor substrate, a first semiconductor optical element including an active layer and a second semiconductor optical element including a waveguide layer are butt-jointed to each other with their optical axes being aligned with each other, includes: a semiconductor regrowth layer including at least one of a diffraction grating layer or an etching stop layer, which is formed by one epitaxial growth across an entire surface above the active layer and the waveguide layer; and a cladding layer formed above the semiconductor regrowth layer.

15 Claims, 13 Drawing Sheets

(51) Int. Cl.
    *H01S 5/22*         (2006.01)
    *H01S 5/227*       (2006.01)

(56) References Cited

U.S. PATENT DOCUMENTS

| | | | | |
|---|---|---|---|---|
| 2010/0260220 A1* | 10/2010 | Yoffe | ............ | H01S 5/06258 372/38.02 |
| 2013/0010824 A1* | 1/2013 | Okumura | ............ | B82Y 20/00 372/45.01 |

FOREIGN PATENT DOCUMENTS

| | | | |
|---|---|---|---|
| JP | 2010-045066 A | 2/2010 |
| JP | 2014-082411 A | 5/2014 |

\* cited by examiner

SEMICONDUCTOR INTEGRATED OPTICAL DEVICE, MANUFACTURING METHOD THEREOF AND OPTICAL MODULE

CROSS-REFERENCE TO RELATED APPLICATION

The present application claims priority from Japanese application JP 2014-248981, filed on Dec. 9, 2014, the content of which is hereby incorporated by reference into this application.

BACKGROUND OF THE INVENTION

1. Field of the Invention

The present invention relates to a semiconductor integrated optical device, a manufacturing method thereof, and an optical module.

2. Description of the Related Art

In recent years, in order to increase a device function and downsize an optical module, there has been developed a semiconductor optical integrated device in which a laser portion configured to generate light and various functional elements are monolithically integrated on the same substrate (for example, JP 2008-277445 A).

As a method of manufacturing the integrated structure, there is known a method involving forming a mask in a partial region of a semiconductor laminated structure first formed by crystal growth, removing an unnecessary part by etching, and forming a different semiconductor laminated structure in the removed region by crystal growth again (hereinafter simply referred to as "regrowth"). The region in which different semiconductor laminated structures are connected to each other is formed such that the optical axes thereof are aligned with each other, and hence the above-mentioned method is generally called a butt joint (BJ). With use of the BJ, an optimal semiconductor laminated structure can be independently designed for each of the semiconductor optical elements to be integrated, thereby being capable of manufacturing a sophisticated semiconductor optical integrated device.

For example, as the semiconductor optical integrated device manufactured by the BJ, in JP 2009-004488 A, there is disclosed a BJ integrated device formed by BJ integrating a semiconductor laser and an electroabsorption modulator on the same substrate and forming a protective layer over the BJ connection, to thereby secure high reliability and yield.

Further, in JP 2010-045066 A, there is disclosed a distributed reflector (DR) laser as a BJ integrated structure for improving both of a single longitudinal mode oscillation yield and a high-speed characteristic of a distributed feedback (DFB) laser.

The DR laser is a semiconductor laser formed by BJ integrating a distributed Bragg reflector (DBR) mirror at a rear facet of the DFB laser. The DBR mirror includes a passive waveguide and a diffraction grating having the same period as the diffraction grating integrated in the DFB laser. Further, a non-reflective film is formed on each of a facet of the DBR mirror that is not connected to the DFB laser and a front facet (laser light emitting end) of the DFB laser. Further, the diffraction gratings have the same phase across the DFB laser region and the DBR mirror region.

As is well known, the single longitudinal mode oscillation characteristic of the DFB laser is significantly affected by the facet phase of the diffraction grating. However, the diffraction grating of the communication-waveband DFB laser is about 200 nm, and hence it is nearly impossible to precisely control the phase of the diffraction grating by cleavage, and thus randomness is caused. In contrast, the DR laser can remove the randomness of the diffraction grating phase that has been caused on the facet of the DFB laser by cleavage, and hence the single longitudinal mode oscillation yield can be increased.

Further, in a general semiconductor laser, reduction in volume of a region of an active layer configured to generate light enables increase in device-specific relaxation oscillation frequency, thereby being capable of improving the high-speed characteristic. As means for reducing the active layer volume simply without affecting the transverse mode and the performance of the active layer, shortening of an oscillator of the device is effective. However, the oscillator length is the device length in the DFB laser, and hence shortening of the oscillator causes difficulty in handling at the time of cleavage. In particular, in order to realize high-speed modulation of 25 Gbps or more, an oscillator length of a directly-modulated laser is required to be shortened to the vicinity of 100 μm, which makes this problem remarkable. In contrast, in the DR laser, the DBR mirror is BJ integrated, and hence a short DFB length required for increasing the speed and a handleable device length can both be attained.

In order to obtain stable laser oscillation in the DR laser, the diffraction gratings are required to be connected in the same phase without disconnection from the DFB laser region to the DBR mirror region.

Further, in JP 2014-082411 A, there is disclosed a DR laser having a structure in which the diffraction gratings are formed both above the active layer of the DFB laser region and above the passive waveguide layer of the DBR mirror region. In the following, such a DR laser is referred to as "upper diffraction grating DR laser" for distinction with the DR laser disclosed in JP 2010-45066 A.

In the upper diffraction grating DR laser, the active layer and the waveguide layer are epitaxially grown on a normal semiconductor substrate, and then the diffraction gratings are formed above those semiconductor layers. Therefore, a characteristic deterioration due to the surface morphology of the semiconductor substrate does not occur. Therefore, it can be said that the upper diffraction grating DR laser has a structure effective for a case where, for example, the diffraction grating is desired to be thickened to realize a high reflection coefficient.

SUMMARY OF THE INVENTION

However, in the upper diffraction grating DR laser disclosed in JP 2014-082411 A, diffraction grating layers are formed by epitaxial growth respectively above the active layer of the DFB laser region and above the waveguide layer of the DBR mirror region in different steps. Therefore, in the DFB laser region and the DBR mirror region, a level difference or discontinuity may be caused between the diffraction gratings.

Further, in the upper diffraction grating DR laser disclosed in JP 2014-082411 A, etching stop layers are formed by epitaxial growth respectively above the active layer of the DFB laser region and above the waveguide layer of the DBR mirror region in different steps. Therefore, in the DFB laser region and the DBR mirror region, a level difference may be caused between the etching stop layers, which may allow an etchant to enter the device from the level difference to cause process failure.

As described above, in a semiconductor optical integrated device configured such that a first semiconductor element including an active layer and a second semiconductor element including a waveguide layer are BJ connected to each other, there has been a problem in that connection failure occurs between the semiconductor layers formed above by epitaxial growth above the active layer and above the waveguide layer, which lowers the yield.

(1) According to one embodiment of the present invention, there is provided a semiconductor integrated optical device, which is configured such that, on a semiconductor substrate, a first semiconductor optical element and a second semiconductor optical element are butt-jointed to each other with optical axes of the first semiconductor optical element and the second semiconductor optical element being aligned with each other, the first semiconductor optical element including an active layer configured to generate light, the second semiconductor optical element including a waveguide layer configured to guide the light generated in the active layer, the semiconductor integrated optical device including: a semiconductor regrowth layer including at least one of a diffraction grating layer or an etching stop layer, which is formed by one epitaxial growth across an entire surface above the active layer and the waveguide layer; and a cladding layer formed above the semiconductor regrowth layer.

(2) According to one embodiment of the present invention, in the semiconductor integrated optical device according to Item (1), the semiconductor regrowth layer includes an etching stop layer used when the cladding layer is subjected to chemical etching with use of a predetermined etching solution.

(3) According to one embodiment of the present invention, in the semiconductor integrated optical device according to Item (1), the semiconductor regrowth layer is made of a common semiconductor material with the cladding layer, and the semiconductor regrowth layer includes: a spacer layer made of a semiconductor material different in doping ion concentration from the cladding layer; and a diffraction grating layer formed on the spacer layer, in which a diffraction grating having a predetermined pitch is formed along an optical axis direction of the light.

(4) According to one embodiment of the present invention, in the semiconductor integrated optical device according to Item (3), the semiconductor regrowth layer further includes an etching stop layer used when the cladding layer is subjected to chemical etching with use of a predetermined etching solution, the spacer layer is formed on the etching stop layer, and the diffraction grating layer is formed on the spacer layer.

(5) According to one embodiment of the present invention, in the semiconductor integrated optical device according to any one of Items (1) to (4), the semiconductor regrowth layer further includes a buffer layer made of a common semiconductor material with the cladding layer in a different doping ion concentration from the cladding layer, and the buffer layer is formed above the active layer and the waveguide layer.

(6) According to one embodiment of the present invention, in the semiconductor integrated optical device according to any one of Items (1) to (5), the semiconductor integrated optical device further includes a side wall-shaped control layer formed at a connection interface between the active layer and the waveguide layer butt-jointed with the optical axes thereof being aligned with each other.

(7) According to one embodiment of the present invention, in the semiconductor integrated optical device according to Item (6), the active layer contains aluminum, the semiconductor integrated optical device further includes a phosphorous spacer layer containing phosphorus, which is formed on the active layer, and the phosphorous spacer layer is formed into an eave shape that covers the active layer and extends from an end portion of the semiconductor integrated optical device on an opposite side to the connection interface to reach a region above the side wall-shaped control layer.

(8) According to one embodiment of the present invention, in the semiconductor integrated optical device according to any one of Items (1) to (7), the first semiconductor optical element is a distributed feedback semiconductor laser, and the second semiconductor optical element is a distributed Bragg reflector mirror.

(9) According to one embodiment of the present invention, in the semiconductor integrated optical device according to any one of Items (1) to (8), the semiconductor integrated optical device further includes a third semiconductor optical element configured to be butt-jointed to the first semiconductor optical element on an opposite side to the second semiconductor optical element with optical axes of the third semiconductor optical element and the first semiconductor optical element being aligned with each other, the third semiconductor optical element includes a waveguide layer configured to guide the light generated in the active layer, and the semiconductor regrowth layer includes at least one of a diffraction grating layer or an etching stop layer, which is formed by one epitaxial growth across an entire surface above the active layer, the waveguide layer of the second semiconductor optical element, and the waveguide layer of the third semiconductor optical element.

(10) According to one embodiment of the present invention, in the semiconductor integrated optical device according to Item (9), the third semiconductor optical element is a distributed Bragg reflector mirror.

(11) According to one embodiment of the present invention, in the semiconductor integrated optical device according to any one of Items (1) to (10), the semiconductor integrated optical device further includes: a reflecting mirror configured to reflect the light generated from the active layer toward a surface of the semiconductor substrate, the reflecting mirror being formed at a light emitting end; and a lens configured to collect light reflected by the reflecting mirror, the lens being formed on the surface of the semiconductor substrate at a position from which the light is emitted.

(12) According to one embodiment of the present invention, there is provided a method of manufacturing a semiconductor integrated optical device configured such that, on a semiconductor substrate, a first semiconductor optical element and a second semiconductor optical element are butt-jointed to each other with optical axes of the first semiconductor optical element and the second semiconductor optical element being aligned with each other, the method including: forming, in the first semiconductor optical element, an active layer configured to generate light; forming, in the second semiconductor optical element, a waveguide layer configured to guide the light generated in the active layer; forming one of a diffraction grating layer and an etching stop layer by one epitaxial growth across an entire surface above the active layer and the waveguide layer; and forming a cladding layer above a semiconductor regrowth layer including the one of the diffraction grating layer and the etching stop layer.

(13) According to one embodiment of the present invention, in the method of manufacturing a semiconductor integrated optical device according to Item (12), the method of manufacturing a semiconductor integrated optical device further includes: sequentially laminating and forming an etching stop layer used when the cladding layer is subjected to chemical etching with use of a predetermined etching solution, a spacer layer made of a common semiconductor material with the cladding layer in a different doping ion concentration from the cladding layer, and a diffraction grating layer; and forming, in the diffraction grating layer, a diffraction grating having a predetermined pitch along an optical axis direction.

(14) According to one embodiment of the present invention, in the method of manufacturing a semiconductor integrated optical device according to Item (12) or (13), the method of manufacturing a semiconductor integrated optical device further includes forming, on an opposite side to the second semiconductor optical element, a third semiconductor optical element including a waveguide layer configured to guide the light generated in the active layer and being butt-jointed to the first semiconductor optical element with optical axes of the third semiconductor optical element and the first semiconductor optical element being aligned with each other, and the forming one of a diffraction grating layer and an etching stop layer by one epitaxial growth includes forming the one of the diffraction grating layer and the etching stop layer by one epitaxial growth across an entire surface above the active layer, the waveguide layer of the second semiconductor optical element, and the waveguide layer of the third semiconductor optical element.

(15) According to one embodiment of the present invention, in the method of manufacturing a semiconductor integrated optical device according to any one of Items (12) to (14), the method of manufacturing a semiconductor integrated optical device further includes: forming a side wall-shaped control layer in contact with a side wall of the active layer and a side wall of the waveguide layer at a connection interface between the active layer and the waveguide layer by changing a shape of the semiconductor substrate by a mass transport phenomenon; and forming a phosphorous spacer layer containing phosphorus immediately above the active layer, the active layer contains aluminum, and the phosphorous spacer layer is formed into an eave shape that covers the active layer and extends from an end portion of the semiconductor integrated optical device on an opposite side to the connection interface to reach a region above the side wall-shaped control layer.

(16) According to one embodiment of the present invention, there is provided an optical module, including: the semiconductor integrated optical device of any one of Items (1) to (11); a driving circuit configured to drive the semiconductor integrated optical device; and a casing configured to house the semiconductor integrated optical device and the driving circuit.

According to the semiconductor integrated optical device of the one embodiment of the present invention, the connection failure may be reduced in the vicinity of the BJ connected interface of the semiconductor regrowth layer including the etching stop layer or the diffraction grating layer, which is formed across a region above the active layer and the waveguide layer, thereby being capable of increasing the yield.

DETAILED DESCRIPTION OF THE INVENTION

Figure 1A:
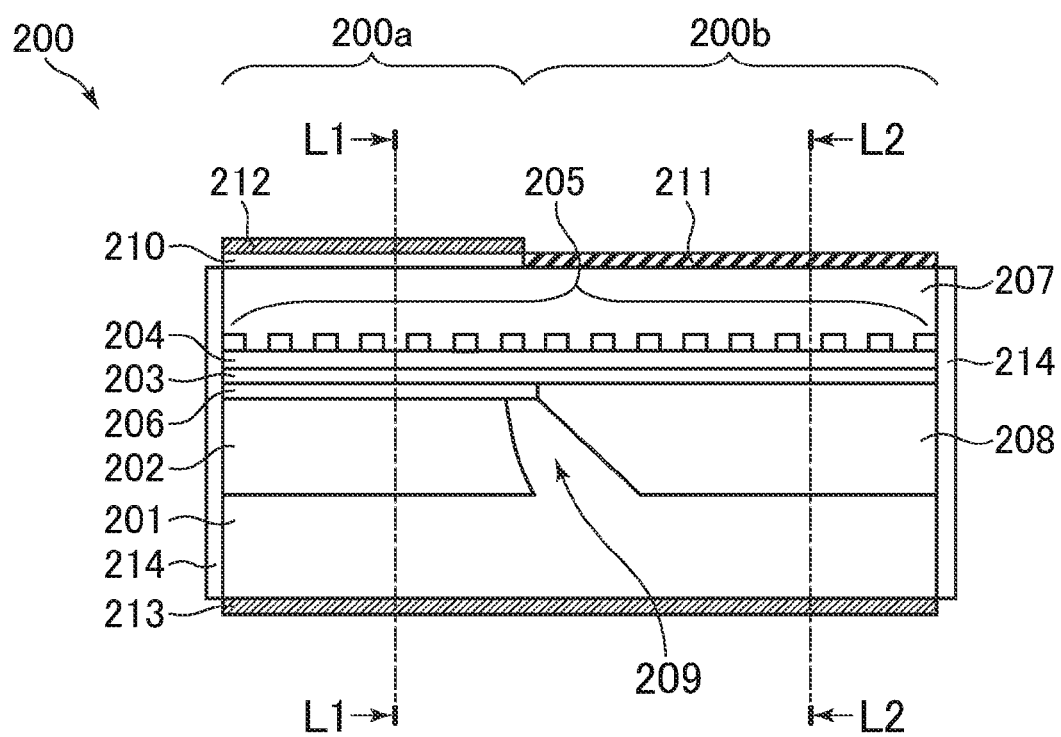
FIG. 1A is a sectional view taken along an optical axis direction of a DR laser according to a first embodiment of the present invention.

Referring to the drawings, modes for carrying out the present invention (hereinafter referred to as embodiments")

are described below. In the drawings, the same or similar components are denoted by the same reference symbols, and repetitive description thereof is omitted. Further, the diagrams are provided for merely describing the embodiments of the present invention, and the sizes in the drawings do not always match with the scale in the embodiments. Further, detailed description of minute level differences and structures not affecting the present invention is omitted herein.

Comparative Example of Present Invention

Prior to the description of embodiments of the present invention, first, one configuration example of an upper diffraction grating DR laser according to a comparative example of the present invention is described.

Figure 8A:
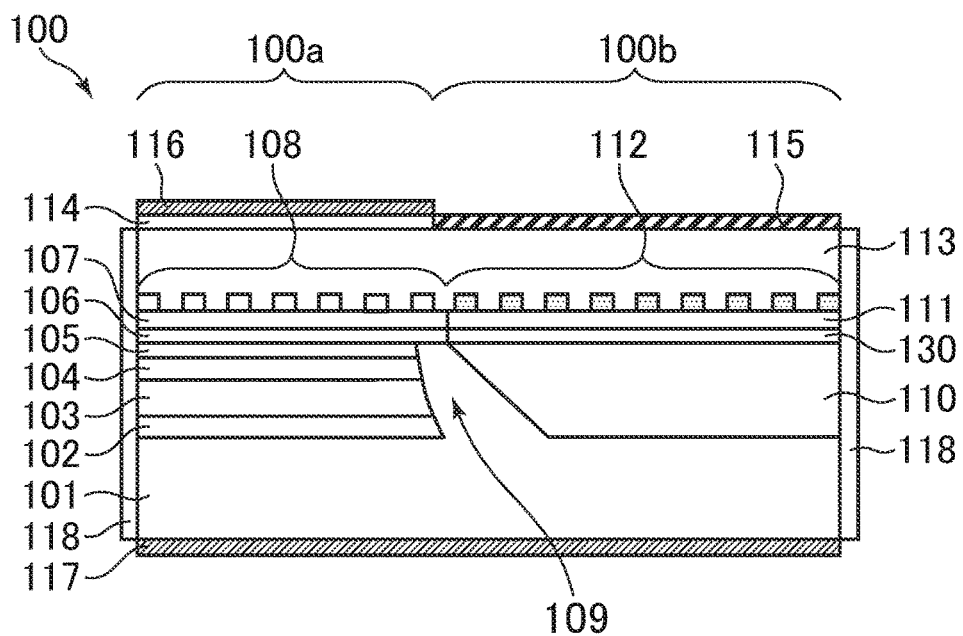
FIG. 8A is a sectional view taken along an optical axis direction of a DR laser according to a comparative example of the present invention.

FIG. 8A is a sectional view taken along an optical axis direction of an upper diffraction grating DR laser 100 according to the comparative example of the present invention. In this case, a DFB laser region 100a includes an n-type InP substrate 101, an n-type InGaAlAs optical guide layer 102, InGaAlAs multiple quantum wells 103, a p-type InGaAlAs optical guide layer 104, a p-type InAlAs electron stop layer 105, a p-type InGaAsP etching stop layer 106, a p-type InP spacer layer 107, a diffraction grating formed by processing a p-type InGaAsP diffraction grating layer 108, a p-type InP cladding layer 113, a p-type InGaAs contact layer 114, and a p-type electrode 116.

Further, a DBR mirror region (passive region) 100b has a structure in which, on the n-type InP substrate 101, an undoped InGaAsP optical waveguide layer 110, a p-type InGaAsP etching stop layer 130, an undoped InP cladding layer 111, an undoped InGaAsP diffraction grating layer 112, the p-type InP cladding layer 113, and a SiO$_2$ protective film 115 are laminated. Further, on the back surface side of the n-type InP substrate 101, an n-type electrode 117 is formed. Further, at both facets of the DR laser 100, dielectric non-reflective films 118 are formed.

Further, an n-type InP side wall-shaped control layer 109 is formed at a connection portion between the DFB laser region 100a and the DBR mirror region 100b.

In this case, a side wall of the n-type InP side wall-shaped control layer 109 on the DFB laser region 100a side is connected to side walls of five semiconductor layers, that is, the n-type InP substrate 101, the n-type InGaAlAs optical guide layer 102, the InGaAlAs multiple quantum wells 103, the p-type InGaAlAs optical guide layer 104, and the p-type InAlAs electron stop layer 105. Further, a side wall of the n-type InP side wall-shaped control layer 109 on the DBR mirror region 100b side is connected to a side wall portion of the undoped InGaAsP optical waveguide layer 110. Further, the p-type InGaAsP etching stop layer 106 is formed so as to cover the n-type InP side wall-shaped control layer 109 and the p-type InAlAs electron stop layer 105.

In this case, the undoped InGaAsP diffraction grating layer 112 is required to be continuously connected to the p-type InGaAsP diffraction grating layer 108 while maintaining a satisfactory crystallinity. In order to realize such a structure with a good yield, it is required to form each semiconductor layer with a good in-plane distribution while preventing its thickness from significantly deviating from its design and to obtain flat crystals in the vicinity of the BJ integrated interface. Specifically, the layers formed immediately below the respective diffraction grating layers are required to be formed as follows. The difference in height between uppermost surfaces of the p-type InAlAs electron stop layer 105 and the optical waveguide layer 110 need to be controlled to be several nanometers or less, the difference in height between uppermost surfaces of the p-type InGaAsP etching stop layer 106 and the p-type InGaAsP etching stop layer 130 need to be controlled to be several nanometers or less, the difference in height between uppermost surfaces of the undoped InP cladding layer 111 and the p-type InP spacer layer 107 need to be also controlled to be several nanometers or less, and the interfaces of those layers need to be connected continuously while maintaining a satisfactory crystallinity. In order to realize such a structure, during the epitaxial growth for forming the BJ integrated structure, it is required to control the manufacturing error in the thickness of each semiconductor layer to the accuracy of several nanometers or less while maintaining the flatness of the BJ integrated interface.

However, due to a mask effect of a SiO$_2$ film, the BJ integrated layer may be formed into an uneven shape. Further, the mass transport phenomenon includes atom transfer, and hence it is generally difficult to maintain the flatness at the accuracy of several nanometers in the vicinity of this region with good controllability and in-plane yield.

Figure 8B:
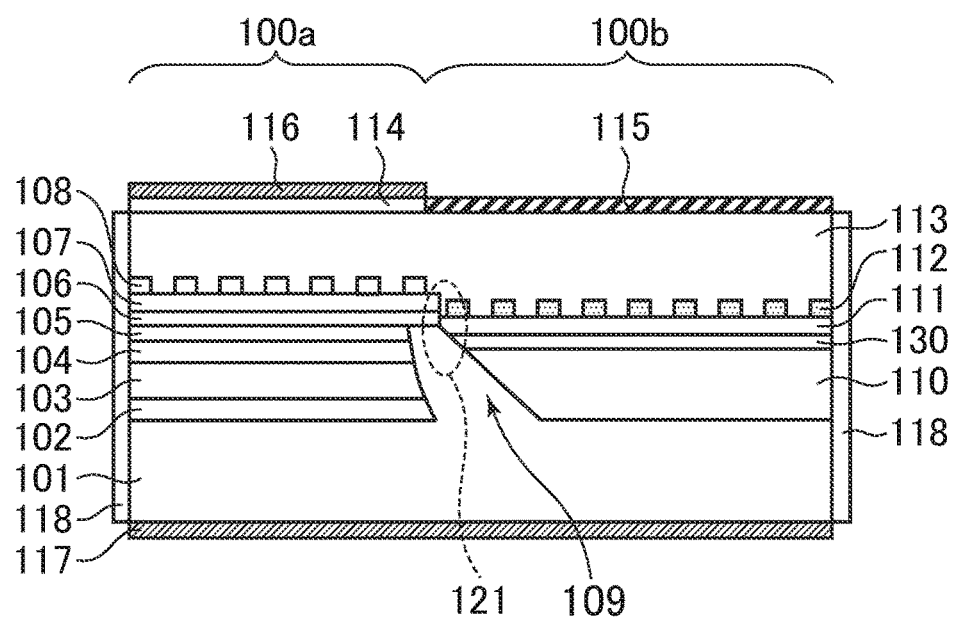
FIG. 8B is a sectional view taken along an optical axis direction of a DR laser according to a comparative example of the present invention.

Further, when the structure of FIG. 8A is actually manufactured, due to factors such as an etching error, influences of the shape of the n-type InP side wall-shaped control layer 109 and the shape of the connection surface of the BJ integration, and a growth thickness error of each layer during the BJ integration, it is difficult to realize the thickness accuracy of about several nanometers or less with a good yield. In the actual case, as represented by a connection portion 121 in FIG. 8B, a level difference may be caused between the undoped InGaAsP diffraction grating layer 112 and the p-type InGaAsP diffraction grating layer 108 to inhibit continuous connection. Further, similarly, the p-type InGaAsP etching stop layer 106 and the p-type InGaAsP etching stop layer 130 may be misaligned.

Note that, when a ridge structure is formed, etching is performed with use of a solution that allows etching of InP but prevents etching of InGaAsP. In the case of the structure of FIG. 8A, the p-type InP cladding layer 113, the p-type InP spacer layer 107, and the undoped InP cladding layer 111 are subjected to etching, but the p-type InGaAsP etching stop layer 106 and the p-type InGaAsP etching stop layer 130 are not subjected to etching, and thus a protruded ridge structure is formed. However, in the case of the structure of FIG. 8B, the p-type InGaAsP etching stop layer 106 and the p-type InGaAsP etching stop layer 130 are misaligned with each other. Therefore, after the etching solution etches the undoped InP cladding layer 111, the etching solution even etches the n-type InP side wall-shaped control layer 109. Thus, the etching cannot be stopped at the p-type InGaAsP etching stop layer 130. As a result, a hollow space or the like is generated due to the etching of the n-type InP side wall-shaped control layer 109, which may affect the device characteristic.

The embodiments of the present invention described below are made to solve the above-mentioned problems.

First Embodiment

A first embodiment of the present invention is obtained by applying the present invention to a ridge waveguide upper diffraction grating DR laser (example of semiconductor optical integrated device) in which a DFB laser region and a DBR mirror region are BJ integrated via a side wall-shaped control layer.

The structure of the upper diffraction grating DR laser according to the first embodiment of the present invention is described with reference to FIG. 1A, FIG. 1B, and FIG. 1C. FIG. 1A is a sectional view taken along an optical axis direction of the upper diffraction grating DR laser. Further, FIG. 1B and FIG. 1C are sectional views taken perpendicular to the optical axis direction at positions L1 and L2 in FIG. 1A, respectively.

As illustrated in FIG. 1A, a DR laser 200 according to the first embodiment includes a DFB laser region 200a to be subjected to current injection to emit light, and a DBR mirror region 200b not subjected to current injection but configured to reflect light generated from the DFB laser region 200a to return the light to the DFB laser region 200a again.

In the DR laser 200 according to this embodiment, currents are injected only into the DFB laser region 200a, and hence a p-type InGaAs contact layer 210 and a p-type electrode 212 are formed only in this region. Further, on the back surface side of the n-type InP substrate 201, an n-type electrode 213 is formed. Further, at both facets of the DR laser 200, dielectric non-reflective films 214 are formed.

Figure 1B:
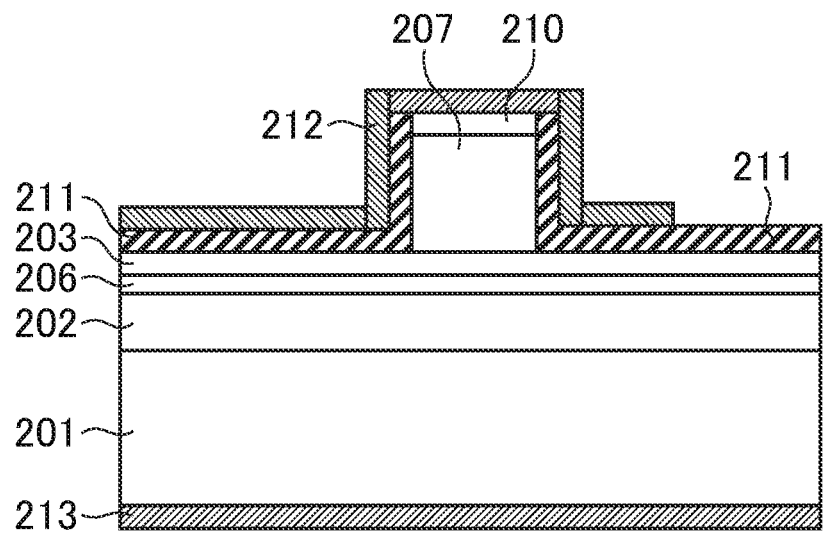
FIG. 1B is a sectional view taken perpendicularly to the optical axis direction of the DR laser according to the first embodiment.
Figure 1C:
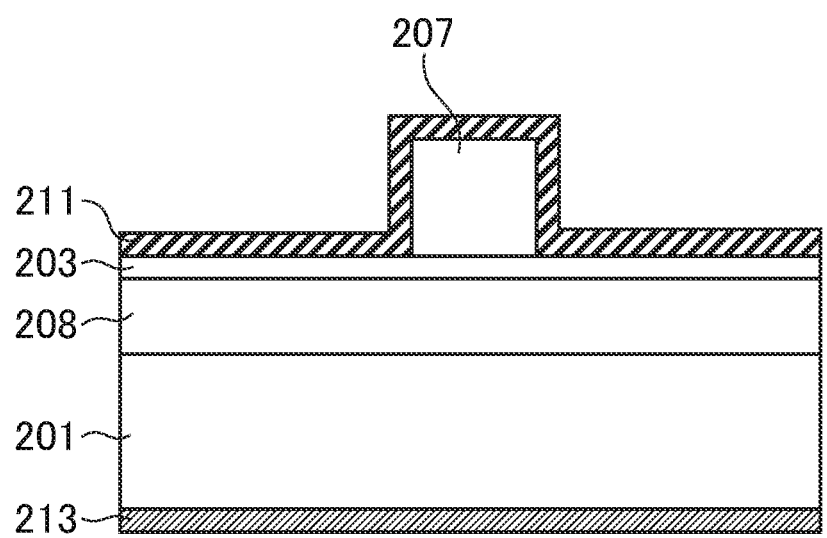
FIG. 1C is a sectional view taken perpendicularly to the optical axis direction of the DR laser according to the first embodiment.

Further, as illustrated in FIG. 1B and FIG. 1C, each of the DFB laser region 200a and the DBR mirror region 200b includes a stripe-shaped mesa portion including a p-type InP cladding layer 207 and being formed so as to extend in a [110] direction or a [1-10] direction (for example, right-left direction of FIG. 1A) of the substrate. The respective stripes are formed so as to be opposed to each other in the optical axis direction.

In this case, the DFB laser region 200a includes, on the n-type InP substrate 201, an InGaAlAs based active layer 202 configured to generate a gain through current injection, a p-type InP spacer layer 206, a p-type etching stop layer 203, a p-type InP spacer layer 204, a p-type InGaAsP diffraction grating layer 205, and the p-type InP cladding layer 207. For example, the length of the DFB laser region 200a is 150 μm. The InGaAlAs based active layer 202 is semiconductor multiple quantum wells obtained by laminating a plurality of InGaAlAs based semiconductor layers. The composition wavelength of the quantum well layer may be 1.31 μm.

Further, the DBR mirror region 200b includes, on an undoped InGaAsP optical waveguide layer 208 formed over the n-type InP substrate 201, the p-type etching stop layer 203, the p-type InP spacer layer 204, the p-type InGaAsP diffraction grating layer 205, and the p-type InP cladding layer 207, and is formed continuous with the rear facet side (right side in FIG. 2A) of the DFB laser region 200a. The undoped InGaAsP optical waveguide layer 208 serving as a waveguide core layer has a composition wavelength not absorbing light generated from the DFB laser region 200a, which may be, for example, 1.15 μm. Further, for example, the DBR mirror region 200b may have a length in the optical axis direction of 250 μm.

Further, between the InGaAlAs based active layer 202 and the undoped InGaAsP optical waveguide layer 208, an n-type InP side wall-shaped control layer 209 having a length of, for example, about 500 nm is formed.

The DR laser 200 according to the first embodiment particularly has a feature in that each of the p-type etching stop layer 203, the p-type InP spacer layer 204, and the p-type InGaAsP semiconductor layer for forming the p-type InGaAsP diffraction grating layer 205 is one common semiconductor layer formed in one epitaxial growth step on the entire surface of the wafer from the DFB laser region 200a to the DBR mirror region 200b. Therefore, even when the film thickness is different from the desired thickness at the time of the growth of the undoped InGaAsP optical waveguide layer 208 in a region for forming the DBR mirror region 200b as in FIG. 8B of the above-mentioned comparative example, the p-type etching stop layer 203 and the p-type InGaAsP diffraction grating layer 205 are grown across the entire region after the undoped InGaAsP optical waveguide layer 208. Therefore, the p-type etching stop layer 203 is not connected at a boundary part, and problems such as a hollow space are not caused in the etching step thereafter.

In this case, the p-type InGaAsP diffraction grating layer 205 is formed by subjecting the above-mentioned p-type InGaAsP semiconductor layer to etching at a constant pitch in the optical axis direction from the DFB laser region 200a to the DBR mirror region 200b, and burying the p-type InGaAsP semiconductor layer subjected to etching with the p-type InP cladding layer 207. For example, the pitch of the diffraction grating may be formed so that the Bragg wavelength of 1.31 μm is obtained. In the DR laser 200 according to the first embodiment, with the above-mentioned configuration, the p-type InGaAsP diffraction grating layer 205 is formed in the same phase continuously from the DFB laser region 200a to the DBR mirror region 200b, and the diffraction grating has a constant height. Therefore, even when the diffraction grating layer is formed into a shape with a level difference at the BJ connected boundary as a whole, the diffraction grating layer itself maintains a continuously connected state, and hence adverse effects on the characteristic due to discontinuity of the diffraction grating layer can be reduced.

Further, in the DR laser 200 according to the first embodiment, the DFB laser region 200a and the DBR mirror region 200b have the same coupling coefficient value, and the equivalent refractive index in each of the regions is constant along the optical axis direction.

Therefore, the p-type etching stop layer 203 and the p-type InGaAsP diffraction grating layer 205 are satisfactorily connected without occurrence of disconnection or a level difference even at a boundary part between the DFB laser region 200a and the DBR mirror region 200b. Therefore, manufacturing failure due to a shape defect of the etching stop layer at the boundary part or deterioration in laser characteristic due to connection failure of the diffraction grating layer are not caused. Thus, as compared to a DR laser in which the semiconductor multi-layered structures in the DFB laser region 200a and the DBR mirror region 200b are respectively formed in different epitaxial growth steps (refer to the above-mentioned comparative example), the manufacturing yield of the device and the characteristic yield can be increased.

The DR laser 200 according to the first embodiment further includes the p-type InP spacer layer 206 formed immediately above the InGaAlAs based active layer 202. The p-type InP spacer layer 206 is processed into an eave shape protruding with respect to the side wall of the InGaAlAs based active layer 202 formed immediately therebelow, and the n-type InP side wall-shaped control layer 209 is formed so as to be connected right under the eave shape.

With such a structure, along the InP spacer layer 206, the height of the n-type InP side wall-shaped control layer 209 and the height of the p-type InGaAlAs based active layer 202 can be aligned to be flush with each other. Therefore, the flatness can be satisfactorily maintained in the surface to be subjected to epitaxial growth of each of the above-mentioned p-type etching stop layer 203, p-type InP spacer layer 204, and p-type InGaAsP semiconductor layer for forming the p-type InGaAsP diffraction grating layer 205. Thus, there is produced an effect of improving the flatness and connectivity of those semiconductor layers to be epitaxially grown.

Next, a method of manufacturing the DR laser 200 according to the first embodiment is described with reference to FIG. 2A to FIG. 2I. Note that, FIG. 2A to FIG. 2I are sectional views taken along the optical axis direction for sequentially illustrating the manufacturing steps for the DR laser 200.

First, in order to form a laser part, the InGaAlAs based active layer 202 and the p-type InP spacer layer 206 are epitaxially grown in the stated order on the n-type InP substrate 201 with use of metal organic chemical vapor deposition or the like. In this case, the InGaAlAs based active layer 202 includes, between an n-type optical confinement layer made of n-type InGaAlAs and a p-type optical confinement layer made of p-type InGaAlAs, a multiple quantum well structure that is made of undoped InGaAlAs and includes, for example, a well layer WL having a thickness of 7 nm and a barrier layer BL having a thickness of 8 nm that are laminated by 8 cycles.

Figure 2A:
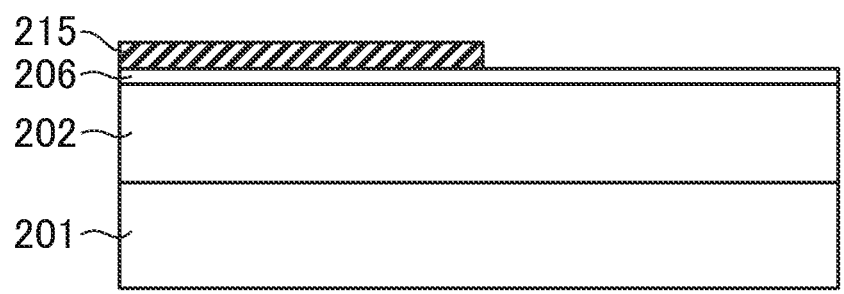
FIG. 2A is a sectional view for illustrating a step of manufacturing the DR laser according to the first embodiment.

Next, as illustrated in FIG. 2A, a $SiO_2$ film is formed on the entire surface of the wafer, and a $SiO_2$ patterning mask 215 for subjecting the p-type InP spacer layer 206 and the InGaAlAs based active layer 202 to etching is formed with use of photolithography and dry etching.

Subsequently, with use of the $SiO_2$ patterning mask 215 as an etching mask, the p-type InP spacer layer 206 and the InGaAlAs based active layer 202 in a part for forming the DBR region are removed by etching. In this case, each of the semiconductor layers is subjected to side etching in an appropriate amount.

Figure 2B:
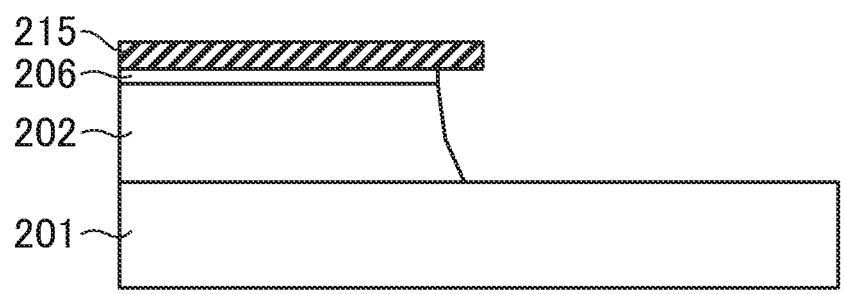
FIG. 2B is a sectional view for illustrating a step of manufacturing the DR laser according to the first embodiment.

For example, first, as illustrated in FIG. 2B, the p-type InP spacer layer 206 and the InGaAlAs based active layer 202 are subjected to etching so that the side walls of both of those semiconductor layers are located on the inner side with respect to the side wall of the $SiO_2$ patterning mask 215.

Figure 2C:
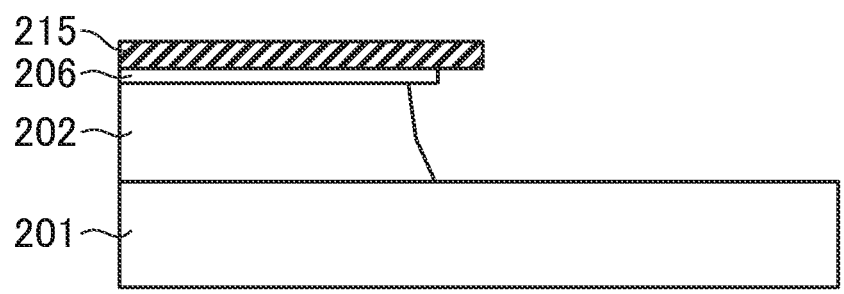
FIG. 2C is a sectional view for illustrating a step of manufacturing the DR laser according to the first embodiment.

Subsequently, as illustrated in FIG. 2C, the InGaAlAs based active layer 202 is subjected to etching so that the side wall of the InGaAlAs based active layer 202 is located on the inner side with respect to the side wall of the p-type InP spacer layer 206.

Such etching is enabled by performing, for example, wet etching twice with use of two types of etchants.

Figure 2D:
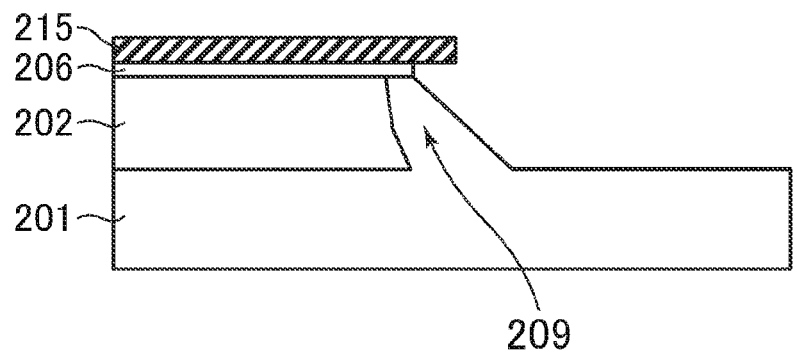
FIG. 2D is a sectional view for illustrating a step of manufacturing the DR laser according to the first embodiment.

The wafer having the eave shape formed thereon in two stages as described above is left in a metal organic chemical vapor deposition furnace so as to undergo heat treatment in a phosphine ($PH_3$) atmosphere. In this case, the temperature and the time of the heat treatment are set to, for example, about 650° C. and about 10 minutes, respectively. At this time, desorption of P atoms from the surface of the n-type InP semiconductor substrate occurs, which causes surface diffusion of In atoms to cause a so-called mass transport phenomenon that the solid surface shape is changed into a shape having the lowest surface energy. In this manner, as illustrated in FIG. 2D, then-type InP side wall-shaped control layer 209 is formed on the side wall of the InGaAlAs based active layer 202 exposed by etching. In this case, the growth conditions may be optimized so that the n-type InP side wall-shaped control layer 209 is formed immediately below the eave part of the p-type InP spacer layer 206. Further, the length of the n-type InP side wall-shaped control layer 209 formed at this time in the optical axis direction may be, for example, 0.5 μm.

The n-type InP side wall-shaped control layer 209 formed as described above is made of a binary material whose composition does not change, and hence has less defects. Therefore, increase in crystal defects at the BJ integrated interface can be suppressed.

Figure 2E:
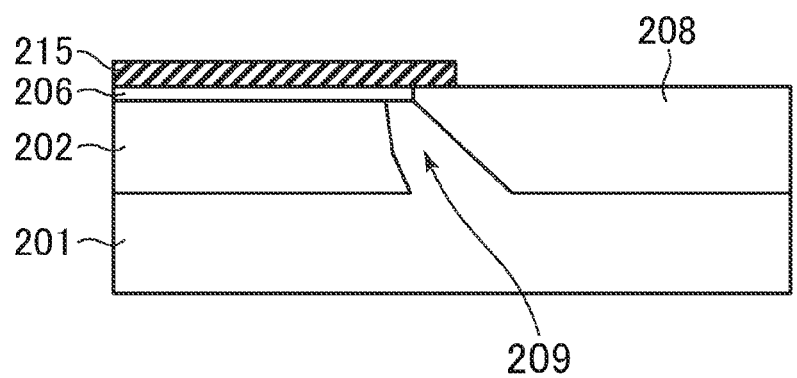
FIG. 2E is a sectional view for illustrating a step of manufacturing the DR laser according to the first embodiment.

Next, as illustrated in FIG. 2E, the undoped InGaAsP optical waveguide layer 208 is BJ integrated by metal organic chemical vapor deposition on the side walls of the p-type InP spacer layer 206 and the n-type InP side wall-shaped control layer 209. In the metal organic chemical vapor deposition, a semiconductor layer is not grown on the $SiO_2$ patterning mask 215. With use of this property, a desired semiconductor layer can be formed only at an arbitrary position inside the wafer surface. Further, by appropriately designing the shape of the $SiO_2$ patterning mask 215 and the length of the eave part, an abnormal growth can be suppressed around the mask at the time of regrowth.

In this embodiment, in the step of forming the $SiO_2$ patterning mask 215 and the step of subjecting the p-type InP spacer layer 206 and the InGaAlAs based active layer 202 to etching described above, the shape of the $SiO_2$ patterning mask 215 and the eave length may be optimized so that the abnormal growth can be suppressed. Further, the growth conditions of the metal organic chemical vapor deposition may be optimized so that each of the p-type InP spacer layer 206 and the undoped InGaAsP optical waveguide layer 208 attains a flat surface.

Figure 2F:
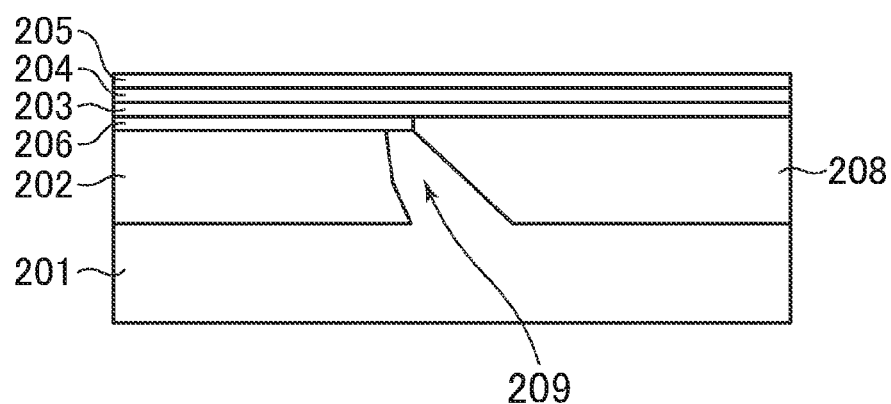
FIG. 2F is a sectional view for illustrating a step of manufacturing the DR laser according to the first embodiment.

Subsequently, as illustrated in FIG. 2F, the wafer is taken out from the growth furnace, and the $SiO_2$ patterning mask 215 is removed. After that, this wafer is put into the growth furnace again so that, on the entire surface of the wafer, the p-type InGaAsP etching stop layer 203, the p-type InP spacer layer 204, and the p-type InGaAsP diffraction grating layer 205 are epitaxially grown in the stated order. Note that, although not shown, a p-type InP protective layer is grown further above the p-type InGaAsP diffraction grating layer 205.

In the above-mentioned steps, the total length in the optical axis direction of the InGaAlAs based active layer 202 and the n-type InP side wall-shaped control layer 209 is, for example, 150 μm. Further, the length of the undoped InGaAsP optical waveguide layer 208 in the optical axis direction is, for example, 250 μm.

After that, with use of electron beam exposure, the p-type InGaAsP diffraction grating layer 205 in the DFB laser region and the DBR mirror region is processed into a diffraction grating shape having a uniform pitch. The structure of the diffraction grating is formed so that the oscillation wavelength of the DFB laser at room temperature is, for example, 1.31 μm.

Note that, in this embodiment, the diffraction grating is evenly formed in the entire region of the DFB laser, but as necessary, a so-called phase shift structure may be formed by shifting the phase of the diffraction grating in a part above the InGaAlAs active layer 202. Alternatively, a structure in which the cycle of the diffraction grating is changed in an axial direction may be formed.

Further, the DBR mirror region 200b may be formed so that the reflectance spectrum thereof has, for example, a stop band in which a reflectance is 98% or more in a range of approximately 40 nm with respect to 1.31 μm. Further, the layer structure may be optimized so that the InGaAlAs active layer 202 and the undoped InGaAsP optical waveguide layer 208 have the same effective propagation constant.

Figure 2G:
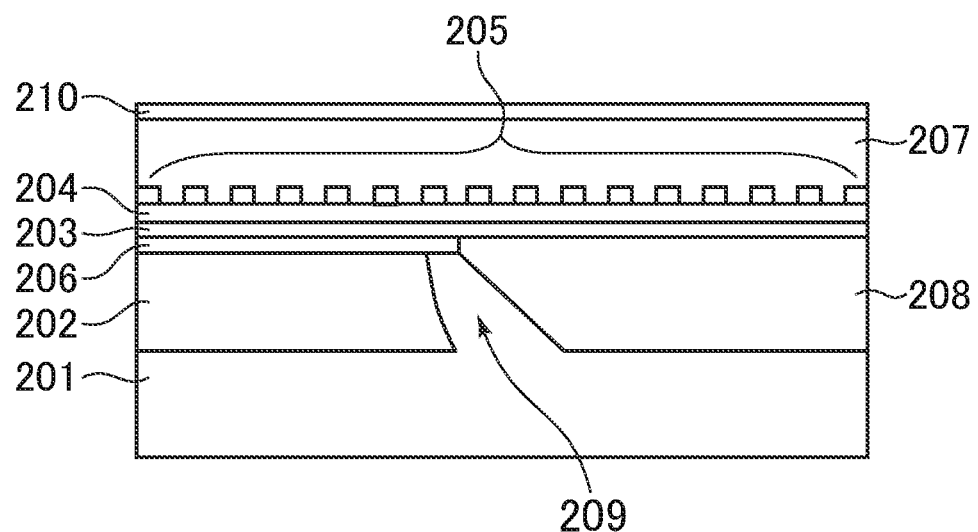
FIG. 2G is a sectional view for illustrating a step of manufacturing the DR laser according to the first embodiment.

After that, as illustrated in FIG. 2G, the wafer is introduced into the growth furnace again so that the p-type InP cladding layer 207 and the p-type InGaAs contact layer 210 are laminated on the entire surface of the wafer. The carrier concentration by the doping of the p-type InGaAs contact layer 210 is set to, for example, $10^{18}$ cm$^{-3}$.

Figure 2H:
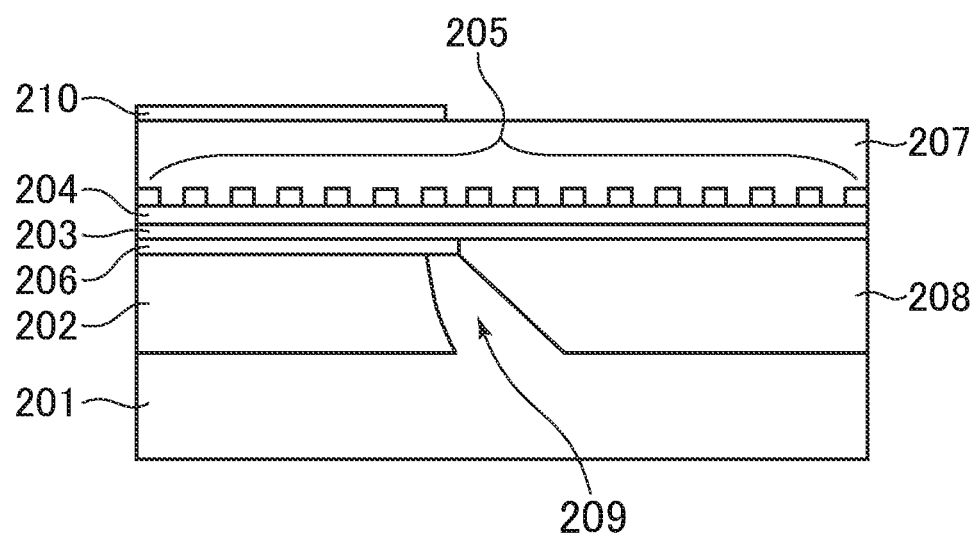
FIG. 2H is a sectional view for illustrating a step of manufacturing the DR laser according to the first embodiment.

Next, as illustrated in FIG. 2H, on the InP wafer having the above-mentioned multi-layered structure formed thereon, with use of a photoresist method and wet etching by a phosphate etchant, the contact layer 210 in a part outside the DFB laser region 200a is removed by etching.

Figure 2I:
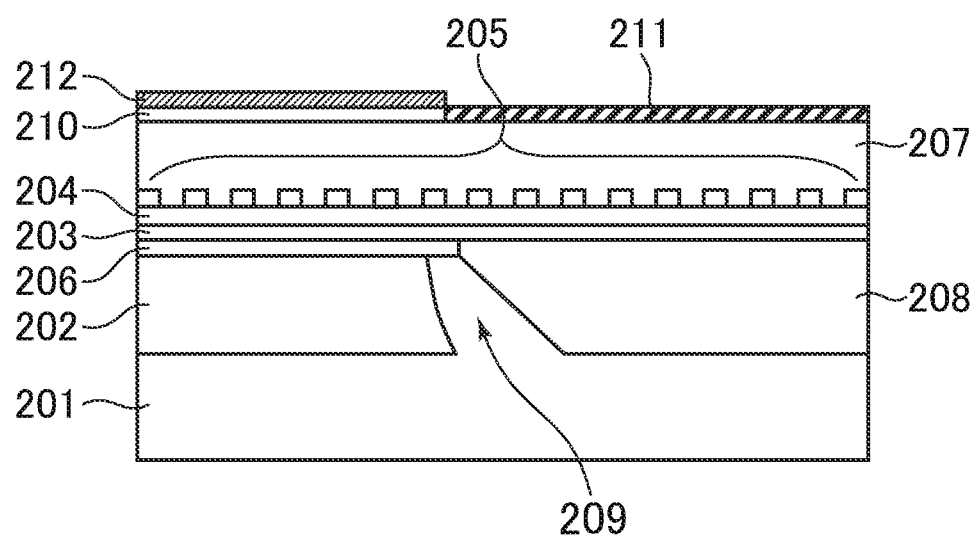
FIG. 2I is a sectional view for illustrating a step of manufacturing the DR laser according to the first embodiment.

Subsequently, this wafer is covered with a silicon dioxide film as a protective mask. With use of this silicon dioxide mask, from the DFB laser region 200a to the DBR mirror region 200b, a ridge waveguide structure is formed as illustrated in FIG. 1B and FIG. 1C. After that, as illustrated in FIG. 2I, a SiO$_2$ protective film 211 is formed on the entire surface of the wafer, and the SiO$_2$ protective film 211 in a part above the p-type InGaAs contact layer 210 is removed. Then, the p-type electrode 212 is vapor-deposited.

After that, the back surface of the substrate is polished to obtain a thickness of 100 μm, and then the n-type electrode 213 is vapor-deposited on the back surface of the substrate. In this manner, the wafer process of the DR laser 200 of this embodiment is completed. After that, chips are cut out from the wafer by cleavage, and the dielectric non-reflective films 214 are formed on the cleaved facets on the DFB laser region side and the DBR region side. Thus, the DR laser 200 illustrated in FIG. 1A is completed.

The oscillation characteristic of the DR laser 200 manufactured by the above-mentioned steps was evaluated. A satisfactory single-wavelength oscillation was obtained, in which an oscillation threshold current was 7 mA, a slope efficiency was 0.3 W/A, and a sub-mode suppression ratio was 40 dB or more at room temperature. Further, characteristic deterioration of the current-light output characteristic and the oscillation spectrum depending on absorption and reflection from the vicinity of the BJ integrated interface was not observed. In view of this, it was confirmed that, in the DR laser 200 according to the first embodiment, the diffraction grating and the etching stop layer were obtained in a state of being satisfactorily connected without disconnection and a level difference in the vicinity of the BJ integrated interface.

Note that, in this embodiment, description is given of an example in which the present invention is applied to an InGaAlAs quantum well laser having a wavelength band of 1.3 μm and being formed on the InP substrate. However, the substrate material, the active layer material, and the oscillation wavelength are not limited to those of this example. The present invention is similarly applicable to other material systems such as a 1.55-μm band InGaAsP laser.

Second Embodiment

Next, a second embodiment of the present invention is described. The second embodiment is obtained by applying the present invention to a ridge waveguide upper diffraction grating DR laser in which the DFB laser region and the DBR mirror region are BJ integrated via a side wall-shaped control layer.

Figure 3:
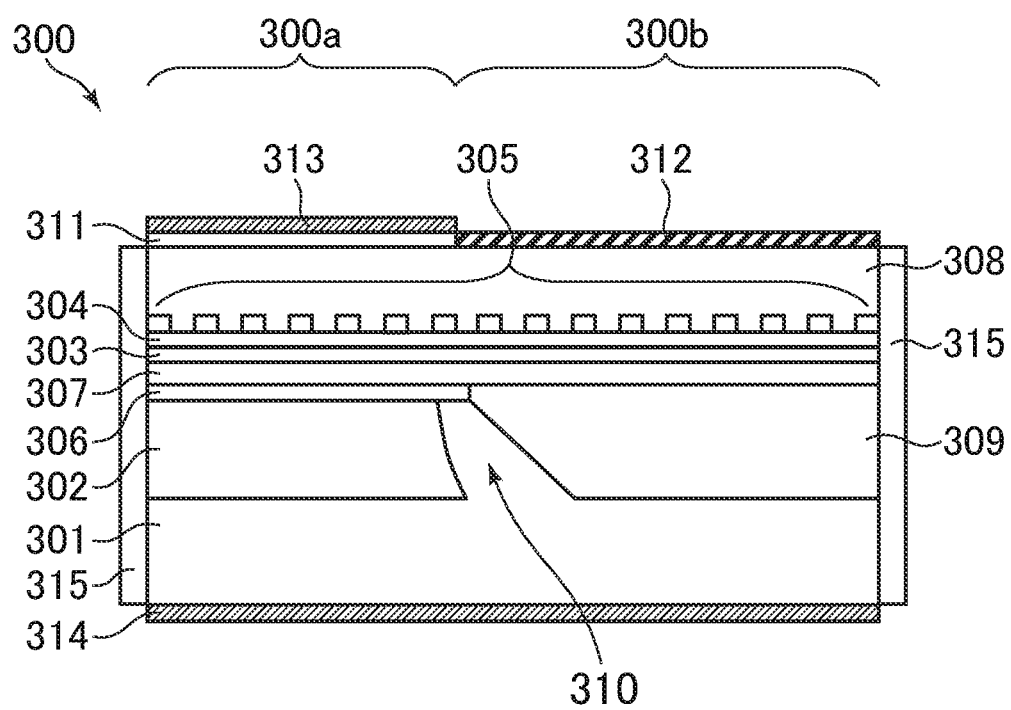
FIG. 3 is a sectional view taken along an optical axis direction of a DR laser according to a second embodiment of the present invention.

FIG. 3 is a sectional view taken along an optical axis direction of a DR laser 300 according to the second embodiment. As illustrated in FIG. 3, the DR laser 300 according to the second embodiment differs from the DR laser 200 described in the first embodiment in that the DR laser 300 includes a p-type InP buffer layer 307 in the lowermost layer of the epitaxial growth layers formed after the BJ integration. Other points are the same.

That is, in the DR laser 300 according to the second embodiment, a DFB laser region 300a includes an n-type InP substrate 301, an InGaAlAs based active layer 302, a p-type InP spacer layer 306, the p-type InP buffer layer 307, a p-type etching stop layer 303, a p-type InP spacer layer 304, a p-type InGaAsP diffraction grating layer 305, and a p-type InP cladding layer 308.

Further, a DBR mirror region 300b includes the n-type InP substrate 301, an undoped InGaAsP optical waveguide layer 309, and common semiconductor layers with the DFB laser region 300a. Note that the common semiconductor layers are the p-type InP buffer layer 307, the p-type etching stop layer 303, the p-type InP spacer layer 304, the p-type InGaAsP diffraction grating layer 305, and the p-type InP cladding layer 308.

Further, between the InGaAlAs based active layer 302 and the undoped InGaAsP optical waveguide layer 309, an n-type InP side wall-shaped control layer 310 is inserted.

A p-type InGaAs contact layer 311 and a p-type electrode 313 are included only in the DFB laser region 300a, and an n-type electrode 314 is formed on the back surface of the n-type InP substrate 301. A SiO$_2$ protective film 312 is formed on the p-type InP cladding layer 308 only in the DBR mirror region 300b. Further, dielectric non-reflective films 315 are formed on the cleaved facets of the DFB laser region 300a and the DBR mirror region 300b.

Although not shown, each of the DFB laser region 300a and the DBR mirror region 300b includes a stripe-shaped mesa portion formed so as to extend in a [110] direction or a [1-10] direction of the substrate with use of the p-type InP cladding layer 308. The respective stripes are formed so as to be opposed to each other in the longitudinal direction.

In the method of manufacturing the DR laser 300 according to the second embodiment, on the n-type InP substrate 301, the InGaAlAs based active layer 302 and the p-type InP spacer layer 306 are sequentially epitaxially grown. Subsequently, similarly to the first embodiment, an unnecessary part is removed by etching, and the n-type InP side wall-shaped control layer 310 is formed by using the mass transport phenomenon.

Subsequently, in the procedure similar to that in the first embodiment, the SiO$_2$ mask is removed. Then, on the entire surface of the wafer, the p-type InP buffer layer 307, the p-type etching stop layer 303, the p-type InP spacer layer 304, and the p-type InGaAsP diffraction grating layer 305 are epitaxially grown in the stated order.

As the steps thereafter, a method similar to that in the first embodiment is used, thereby being capable of manufacturing the upper diffraction grating DR laser 300. The total length in the optical axis direction of the InGaAlAs based active layer 302 and the n-type InP side wall-shaped control layer 310 is, for example, 150 μm. Further, the length of the undoped InGaAsP optical waveguide layer 309 in the optical axis direction is, for example, 250 μm.

In the DR laser manufactured as described above, a satisfactory single-wavelength oscillation was obtained, in which an oscillation threshold current was 7 mA, a slope efficiency was 0.3 W/A, and a sub-mode suppression ratio was 40 dB or more at room temperature.

Further, characteristic deterioration of the current-light output characteristic and the oscillation spectrum depending on absorption and reflection from the vicinity of the BJ integrated interface was not observed. Thus, it was confirmed that a satisfactory single-wavelength oscillation with a sub-mode suppression ratio of 40 dB or more was obtained.

Third Embodiment

Figure 4A:
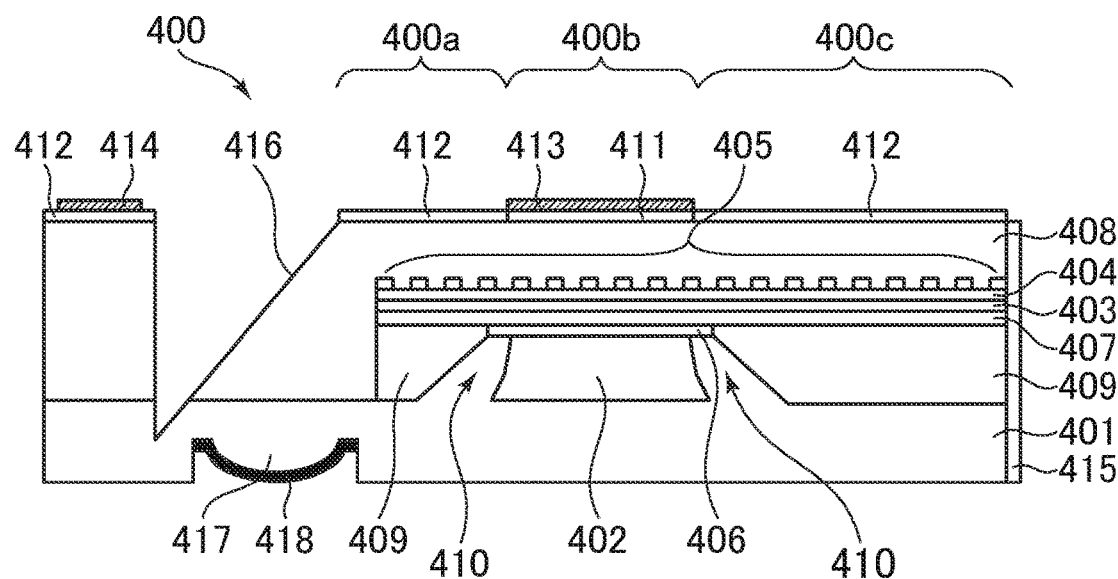
FIG. 4A is a sectional view taken along an optical axis direction of a DR laser according to a third embodiment of the present invention.
Figure 4B:
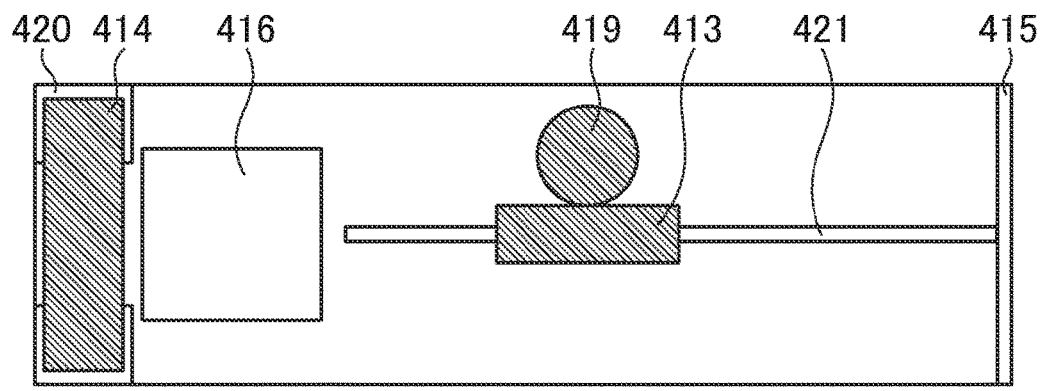
FIG. 4B is a top view of the DR laser according to the third embodiment.

Next, a third embodiment of the present invention is described. The third embodiment is an example obtained by applying the present invention to a DR laser having a horizontal oscillator surface emitting mechanism (example of surface emitting semiconductor device). FIG. 4A is a sectional view taken along an optical axis direction of a DR laser 400 according to this embodiment, and FIG. 4B is a top view thereof.

As illustrated in FIG. 4A, in the DR laser 400 according to the third embodiment, a front DBR mirror region 400a and a rear DBR mirror region 400c are respectively BJ integrated to both ends of a DFB laser region 400b via side wall-shaped control layers, and an integrated mirror 416 is integrated on the front side of the front DBR mirror region 400a. Further, an integrated lens 417 is integrated at an emitting surface that the laser light generated from the DFB laser region 400b and reflected by the integrated mirror arrives.

In the following, with reference to FIG. 4A and FIG. 4B, the structure of the DR laser 400 is described in detail. The DFB laser region 400b includes an InGaAlAs active layer 402 and a p-type InP spacer layer 406 that are laminated on an n-type InP substrate 401, and further includes thereon a p-type InP buffer layer 407, a p-type etching stop layer 403, a p-type InP spacer layer 404, a p-type InGaAsP diffraction grating layer 405, and a p-type InP cladding layer 408. The front DBR mirror region 400a and the rear DBR mirror region 400c have the same multi-layered structure, but those regions have different lengths in the optical axis direction. In this embodiment, the length of the front DBR mirror region 400a in the optical axis direction is smaller than the length of the rear DBR mirror region 400c in the optical axis direction. The lengths of the front DBR mirror region 400a and the rear DBR mirror region 400c in the optical axis direction are set to, for example, 50 µm and 250 µm, respectively.

The front DBR mirror region 400a and the rear DBR mirror region 400c each include the n-type InP substrate 401, an undoped InGaAsP optical waveguide layer 409, and common semiconductor layers with the DFB laser region 400b. Note that the common semiconductor layers are the p-type InP buffer layer 407, the p-type etching stop layer 403, the p-type InP spacer layer 404, the p-type InGaAsP diffraction grating layer 405, and the p-type InP cladding layer 408. Further, an n-type InP side wall-shaped control layer 410 is inserted between the InGaAlAs based active layer 402 and the undoped InGaAsP optical waveguide layer 409.

As illustrated in FIG. 4B, each of the DFB laser region 400b, the front DBR mirror region 400a, and the rear DBR mirror region 400c includes a ridge stripe 421 formed so as to extend in a [110] direction or a [1-10] direction of the substrate with use of the p-type InP cladding layer 408. The respective stripes are formed so as to be opposed to each other in the longitudinal direction.

On the front side of the front DBR mirror region 400a, the integrated mirror 416 is formed with use of p-type InP. A p-type InGaAs contact layer 411 and a p-type electrode 413 are formed only in the DFB laser region. The p-type electrode 413 includes a p-type electrode pad portion 419. Further, although not shown, the surface of the n-type InP substrate 401 is exposed by removing a part ranging from the p-type InP cladding layer to the active layer by etching to form an n-type electrode contact portion 420. An n-type electrode 414 is connected to the n-type electrode contact portion 420 and is led out over the p-type InP cladding layer. A structure in which both p-type and n-type electrodes are arranged on the surface of the wafer is obtained. Note that a $SiO_2$ protective film 412 is formed on the p-type InP cladding layer 308 in the front DBR mirror region 400a, the rear DBR mirror region 400c, and the like.

Next, a method of manufacturing the DR laser according to the third embodiment is described. Steps until forming of the diffraction grating are similar to those in the second embodiment. However, in this embodiment, the DBR is integrated on each of the front and rear sides of the DFB region, and hence the front and rear parts of the InGaAlAs active layer 402 are removed by etching along the optical axis direction. After that, in the procedure similar to that in the second embodiment, the n-type InP side wall-shaped control layer 410 is formed. Subsequently, the p-type InP spacer layer 406, the p-type InP buffer layer 407, the p-type etching stop layer 403, the p-type InP spacer layer 404, and the p-type InGaAsP diffraction grating layer 405 are grown. Similarly to the second embodiment, also in this embodiment, the p-type InP buffer layer 407 is introduced, and thus the etching stop layer and the diffraction grating layer can be grown on the front surface of the wafer in a good-flatness surface state. Therefore, the device yield is increased.

Subsequently, the diffraction grating is formed in the procedure similar to that in the second embodiment. After that, in a part on the front side with respect to the front DBR mirror region 400a, the active layer, the spacer layer, the etching stop layer, and the diffraction grating layer are removed by etching. Under this state, on the front surface of the wafer, the p-type InP cladding layer 408 is epitaxially grown. As a result, a structure in which the front part of the front DBR mirror region 400a is buried in the p-type InP cladding layer is obtained.

After that, the ridge stripe 421 is formed. At this time, the p-type InP cladding layer 408 is removed in a region in which the n-type electrode is to be formed simultaneously with the formation of the ridge stripe. And then, the p-type InGaAs contact layer 411 is removed in a region including the front DBR mirror region 400a, the rear DBR mirror region 400c, and a 45 degree mirror region in which the integrated mirror 416 is to be formed. At this time, the p-type etching stop layer 403, and the p-type InP buffer layer 407, and the undoped InGaAsP optical waveguide layer 409 are removed in a region the n-type electrode contact portion 420 is to be formed in a common process.

Subsequently, a silicon nitride film (SiN protective film) for an etching mask is formed, and the p-type InP buried in a part on the front side of the front DBR mirror region 400a is subjected to etching at an inclination angle of 45°, to thereby form the front monolithic integrated mirror 416 formed of the p-type InP cladding layer 408 and the n-type InP substrate 401. This 45° inclination etching is realized by etching the wafer while inclining the wafer at an angle of 45° with use of chemically assisted ion beam etching (CAIBE) using chlorine and argon gas. Note that, the etching method using CAIBE is described in this embodiment, but reactive ion beam etching (RIBE) using chlorine gas or wet etching may be used. The sectional shape taken along the optical axis direction of the front monolithic integrated mirror 416 serving as a reflecting mirror is formed into a single bevel shape in which one cut surface is perpendicular to the surface of the n-type InP substrate 401, but may be formed into a V-shape in which both cut surfaces are inclined with respect to the surface of the n-type InP substrate 401. Alternatively, a structure only with an inclined surface may be employed. In this embodiment, the monolithic integrated mirror is formed at an angle of 45°, but other angles may be employed.

Next, the SiN protective film in a part on the p-type InGaAs contact layer 411 in the DFB laser region 400b is removed, the p-type electrode 413 is vapor-deposited, and subsequently, the n-type electrode 414 is vapor-deposited on the n-type electrode contact portion 420.

After that, the back surface of the substrate is polished to obtain a thickness of 150 μm, and then a silicon nitride mask is formed on the back surface of the substrate. Subsequently, reactive ion etching is performed with use of a mixed gas of methane and hydrogen so as to obtain, for example, a toroidal circular shape (or elliptical shape) having a diameter of 125 μm and a depth of 30 μm. Subsequently, the silicon nitride mask on the columnar part surrounded by a part recessed into a toroidal shape is removed, and then wet etching is performed. With this, the surface of the columnar part is etched so that the corners are rounded, to thereby form the monolithic integrated lens 417 serving as a back surface InP lens. Note that, the surface of the monolithic integrated lens 417 is covered with a reflection preventing film 418 in a later step.

In this embodiment, the oscillator length of the DFB is set to, for example, 70 μm, and the coupling coefficient of the diffraction grating is set to 200 $cm^{-1}$, but values other than those values may be employed. Further, at this time, the entire length of the device in the optical axis direction is set to, for example, 600 μm. Further, the diffraction grating pitch is set uniform in the wafer, and is formed to attain oscillation at, for example, 1.3 μm. Note that, the diffraction grating may have a phase shift in the DFB, or may have a structure in which a plurality of pitch lengths are set in the optical axis direction.

Subsequently, the wafer is cleaved into a device shape, and a dielectric non-reflective film 415 is formed on the facet of the rear DBR mirror region 400c.

The direct current characteristic of the DR laser 400 according to the third embodiment was evaluated. A satisfactory oscillation characteristic in which a threshold current was 5 mA and a slope efficiency was 0.35 W/A at room temperature was obtained. Further, a satisfactory single-wavelength oscillation was obtained at a wavelength of 1.3 μm. Further, characteristic deterioration of the oscillation spectrum shape depending on absorption and reflection from the vicinity of the BJ integrated interface was not observed. Further, at this time, the far field pattern (FFP) of the laser light was about 3° in full width at half maximum both in oscillation perpendicular and horizontal directions, thereby being capable of obtaining an extremely narrow FFP reflecting the lens integration. A direct optical coupling experiment between this laser and a single mode fiber (SMF) was executed, and a satisfactory optical coupling with a coupling loss of about −3 dB was obtained. Further, the positional misalignment amount at the time of coupling efficiency deterioration of −1 dB was around 10 μm. Therefore, with use of the DR laser 400 according to this embodiment, reduction in number of components and easy mounting are enabled.

Next, the high-frequency characteristic of this laser was measured. A wide bandwidth at room temperature reflecting a short oscillation structure was able to be obtained, in which a modulation bandwidth at room temperature with a low bias current of 40 mA was 30 GHz. As described above, according to the third embodiment of the present invention, a high-speed device suitable as a next-generation high-speed light source responding to easy mounting was able to be manufactured with a good yield.

Fourth Embodiment

Figure 5A:
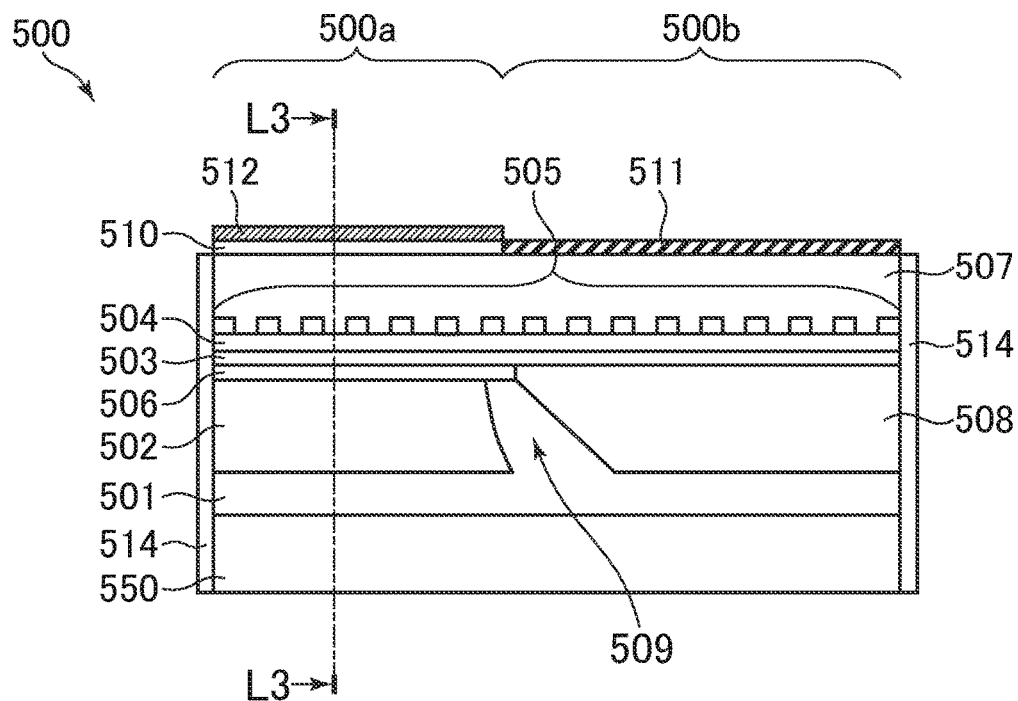
FIG. 5A is a sectional view taken along an optical axis direction of a DR laser according to a fourth embodiment of the present invention.
Figure 5B:
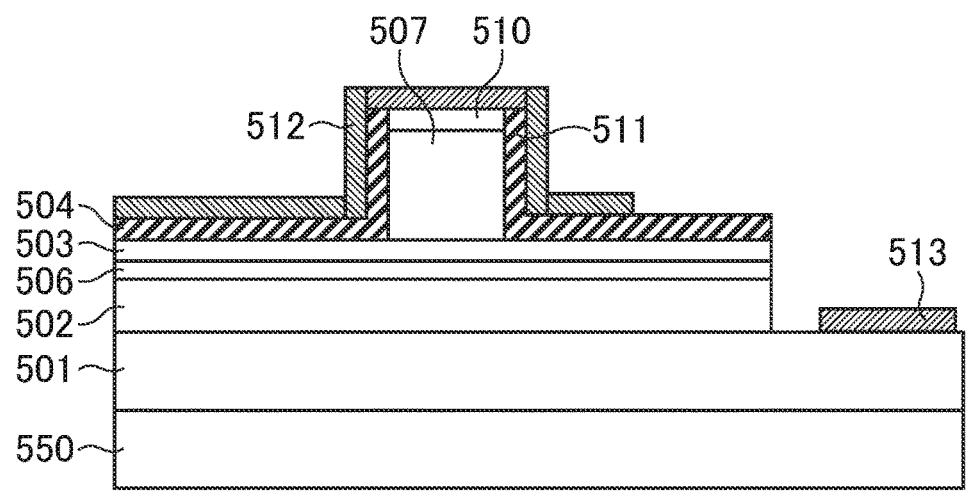
FIG. 5B is a sectional view taken perpendicularly to the optical axis direction of the DR laser according to the fourth embodiment.

Next, a fourth embodiment of the present invention is described. The fourth embodiment is an example obtained by applying the present invention to an upper diffraction grating DR laser formed on a semi-insulating InP substrate. FIG. 5A is a sectional view taken along an optical axis direction of a DR laser 500 according to this embodiment, and FIG. 5B is a sectional view taken perpendicularly to the optical axis direction at a position L3 in FIG. 5A. The multi-layered structure of the DR laser 500 according to this embodiment is the same as that in the DR laser 200 described in the first embodiment except for the substrate. Therefore, the epitaxial growth step including the side wall-shaped control layer formation and the BJ integration is the same as that in the first embodiment.

As illustrated in FIG. 5A, the DR laser 500 according to this embodiment includes an n-type InP buffer layer 501 formed on a semi-insulating InP substrate 550, and a DR laser structure similar to that in the first embodiment is formed above the semi-insulating InP substrate 550. As the semi-insulating InP substrate, a Fe-doped InP substrate is used. The thickness of the n-type InP buffer layer is set to, for example, 5 μm.

A DFB laser region 500a has a multi-layered structure obtained by laminating, on the n-type InP buffer layer 501, an InGaAlAs based active layer 502, a p-type InP spacer layer 506, a p-type etching stop layer 503, a p-type InP spacer layer 504, a p-type InGaAsP diffraction grating layer 505, and a p-type InP cladding layer 507.

Further, a DBR mirror region 500b has a multi-layered structure obtained by laminating, on the n-type InP buffer layer 501, an undoped InGaAsP optical waveguide layer 508 and common semiconductor layers with the DFB laser region 500a. Note that the common semiconductor layers are the p-type etching stop layer 503, the p-type InP spacer layer 504, the p-type InGaAsP diffraction grating layer 505, and the p-type InP cladding layer 507.

Further, between the InGaAlAs based active layer 502 and the undoped InGaAsP optical waveguide layer 508, an n-type InP side wall-shaped control layer 509 is inserted.

A p-type InGaAs contact layer 510 and a p-type electrode 512 are included only in the DFB laser region 500a. A $SiO_2$ protective film 511 is formed on the p-type InP cladding layer 507 in the DBR mirror region 500b. Further, dielectric non-reflective films 514 are formed on the cleaved facets of the DFB laser region 500a and the DBR mirror region 500b.

Although not shown, each of the DFB laser region 500a and the DBR mirror region 500b includes a stripe-shaped mesa portion formed so as to extend in a [110] direction or a [1-10] direction of the substrate with use of the p-type InP cladding layer 507. The respective stripes are formed so as to be opposed to each other in the longitudinal direction.

In this case, as illustrated in FIG. 5B, a part of the wafer is subjected to etching to reach the n-type InP buffer layer 501, and an n-type electrode 513 is vapor-deposited on the exposed surface of the n-type InP buffer layer 501. Further, although not shown, the n-type InP buffer layer 501 in a region between adjacent devices is removed by etching so that a structure in which the respective devices arranged in the optical axis vertical direction are electrically isolated from each other is obtained. Note that, the length of the InGaAlAs based active layer 502 in the optical axis direction or other dimensions and the design of the diffraction grating may be the same as those of the DR laser according to the first embodiment.

The direct current characteristic of the DR laser 500 on the semi-insulating substrate having the above-mentioned structure was evaluated. A satisfactory oscillation characteristic was obtained, in which a threshold current was 5 mA and a slope efficiency was 0.35 W/A at room temperature, which was equivalent to the case where the laser was formed on the n-type InP substrate. Further, characteristic deterioration of the oscillation spectrum shape depending on absorption and reflection from the vicinity of the BJ integrated interface was not observed similarly to the laser on the n-type InP substrate. Thus, a DR laser with a good yield was able to be manufactured.

Subsequently, this laser was cut out into a 4-channel array shape, and an eye opening at 25 Gb/s was evaluated. In the DR laser according to this embodiment, the respective channels are electrically isolated from each other, and hence differential drive of each channel is possible in the array structure. The eye waveform at 25 Gb/s by the differential drive was evaluated while fixing the direct bias current applied to each device to 60 mA. As a result, an eye opening at a low amplitude current of 20 mA was able to be confirmed.

In view of the above, according to the fourth embodiment of the present invention, the DR laser responding to low power drive was able to be manufactured with a high yield.

Fifth Embodiment

Figure 6A:
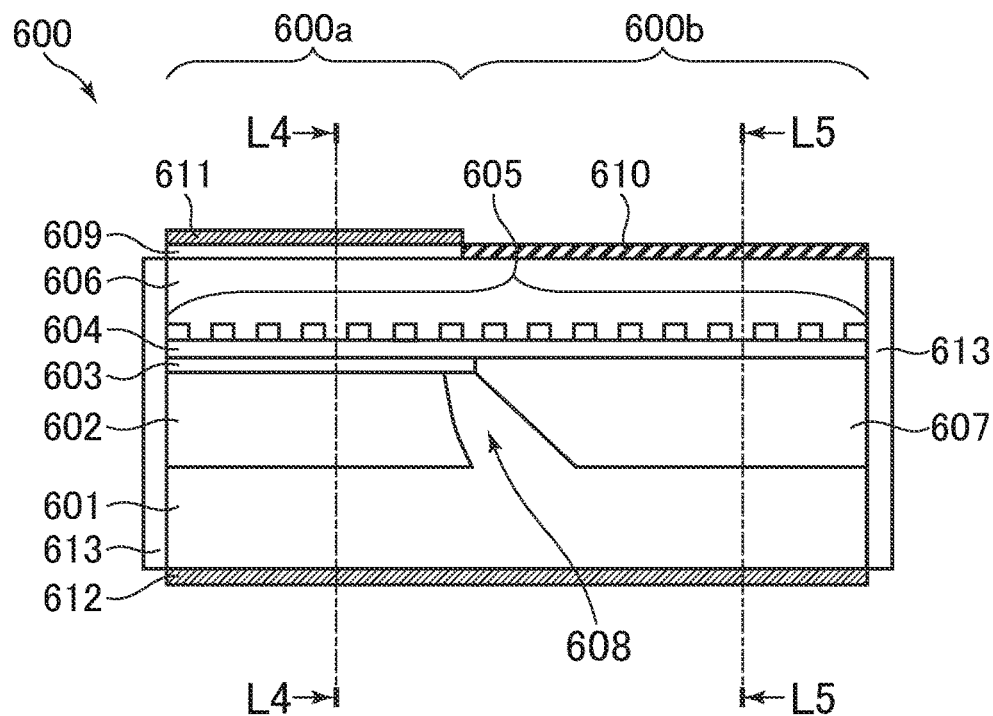
FIG. 6A is a sectional view taken along an optical axis direction of a DR laser according to a fifth embodiment of the present invention.
Figure 6B:
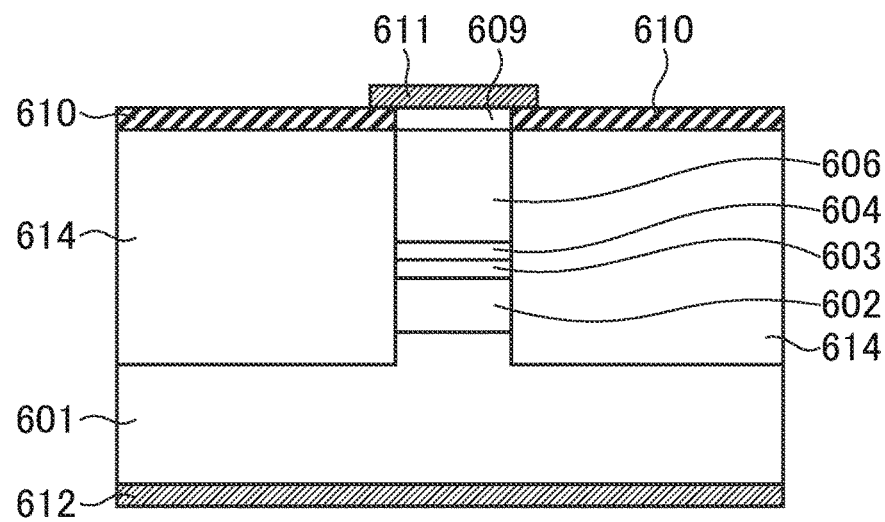
FIG. 6B is a sectional view taken perpendicularly to the optical axis direction of the DR laser according to the fifth embodiment.
Figure 6C:
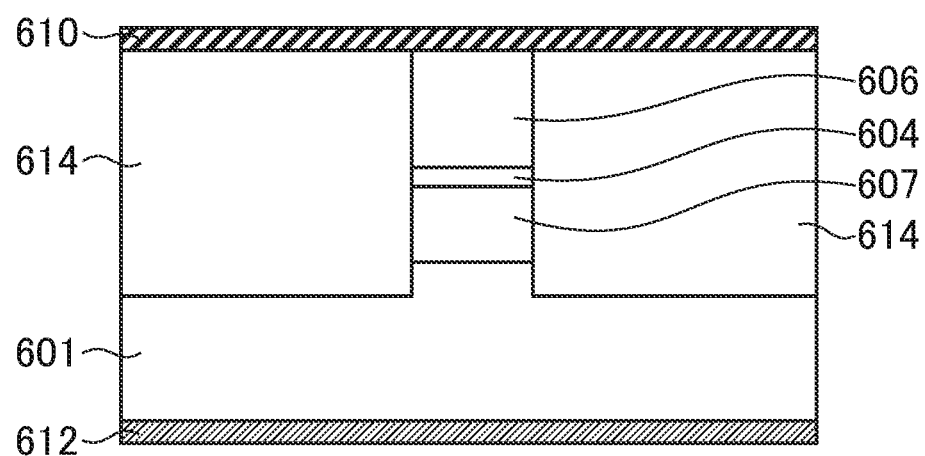
FIG. 6C is a sectional view taken perpendicularly to the optical axis direction of the DR laser according to the fifth embodiment.

Next, a fifth embodiment of the present invention is described. The fifth embodiment is an example obtained by applying the present invention to a buried hetero (BH) upper diffraction grating DR laser. FIG. 6A is a sectional view taken along an optical axis direction of an optical oscillator part of a DR laser 600 according to this embodiment. FIG. 6B and FIG. 6C are sectional views taken perpendicularly to the optical axis direction at positions L4 and L5 in FIG. 6A, respectively.

As illustrated in FIG. 6A, the structure of the cross section in the optical axis direction of the optical oscillator part of a DFB laser region 600a according to this embodiment includes, on an n-type InP substrate 601, an InGaAlAs based active layer 602, p-type InP spacer layers 603 and 604, a p-type InGaAsP diffraction grating layer 605, a p-type InP cladding layer 606, and a p-type InGaAs contact layer 609. In this case, the length of the DFB laser region 600a is set to, for example, 150 μm.

Further, as illustrated in FIG. 6B, the structure in the optical axis vertical direction of the DFB laser region 600a is a so-called high-mesa BH structure obtained by removing the InGaAlAs based active layer 602 in a part other than the optical oscillator part by etching to reach the n-type InP substrate 601, and then filling both side parts with semi-insulating InP buried layers 614. In this case, as the semi-insulating InP, Fe-doped InP is used, but Ru-doped InP may be used as other semi-insulating InP.

Further, the optical oscillator part of a DBR mirror region 600b includes, on the n-type InP substrate 601, an undoped InGaAsP optical waveguide layer 607, and the p-type InP spacer layer 604, the p-type InGaAsP diffraction grating layer 605, and the p-type InP cladding layer 606, which are semiconductor layers common to the DFB laser region 600a. Further, the length of the DBR mirror region 600b is 250 μm.

Further, the structure in the optical axis vertical direction is obtained by, as illustrated in FIG. 6C, removing both sides of the semiconductor layers to be formed into a waveguide layer by etching to reach the n-type InP substrate 601, and filling both the sides with the same semi-insulating InP buried layers 614 as the DFB laser region 600a.

In this case, the DBR mirror region 600b is formed continuously with the rear facet (right side in FIG. 6A) of the DFB laser region 600a, and the high-mesa stripe structure is formed continuously from the DFB laser region 600a.

Further, between the InGaAlAs based active layer 602 and the undoped InGaAsP optical waveguide layer 607, an n-type InP side wall-shaped control layer 608 is inserted. Further, the p-type InGaAs contact layer 609 and a p-type electrode 611 are included only in the DFB laser region 600a to be subjected to current injection, and are not formed in the DBR mirror region 600b. A $SiO_2$ protective film 610 is formed on the p-type InP cladding layer 606 in the DBR mirror region 600b.

On the back surface of the n-type InP substrate 601, an n-type electrode 612 is formed. Further, on the cleaved facets of the DFB laser region 600a and the DBR mirror region 600b, dielectric non-reflective films 613 are formed.

Next, a method of manufacturing the DR laser 600 of this embodiment is described. The method of manufacturing the DR laser 600 of this embodiment is the same as the first embodiment until the undoped InGaAsP optical waveguide layer 607 is BJ integrated. In the subsequent epitaxial growth, in this embodiment, the p-type InP spacer layer 604 and the p-type InGaAsP diffraction grating layer 605 are grown across the entire surface of the wafer. Subsequently, the diffraction grating is formed in a procedure similar to that in the first embodiment, and the p-type InP cladding layer 606 is epitaxially grown. In this case, the diffraction grating has a constant pitch, but a phase shift may be formed in the DFB laser region 600a. Alternatively, the pitch length may be partially modulated so that a part of the diffraction grating has a pitch different from that in other regions.

Therefore, also in this embodiment, similarly to the first embodiment, from the DFB laser region 600a to the DBR mirror region 600b including the vicinity of the boundary of the BJ integration, the diffraction grating layer having a satisfactory connectivity is formed.

Subsequently, from the DFB laser region 600a to the DBR mirror region 600b, a stripe-shaped $SiO_2$ patterning mask is formed, and a semiconductor multi-layer in an unnecessary part is removed by etching to reach the n-type InP substrate 601.

Subsequently, under a state in which the $SiO_2$ mask is left, the wafer is introduced into the organic metal growth furnace, to thereby grow the semi-insulating InP in apart subjected to etching removal. In this case, as the semi-insulating InP, Fe-doped InP is used. With the above-mentioned steps, the high-mesa BH structure is completed, in which the semiconductor layers are formed as illustrated in FIG. 6B and FIG. 6C. After that, the p-type electrode 611 is formed only in a predetermined part of the DFB laser region 600a, and the wafer is polished to obtain a thickness of 100 μm. After the polishing, the n-type electrode 612 is formed on the back surface of the n-type InP substrate 601.

A laser chip is cut out by cleavage from the wafer subjected to the above-mentioned steps, and then the dielectric non-reflective films 613 are formed on both the facets of the device. Thus, the DR laser 600 is completed.

The direct current characteristic of the DR laser 600 was evaluated. As a result, laser oscillation reflecting efficient current injection due to the BH structure was obtained with a low threshold current of 10 mA under a high temperature of 85° C. Further, a satisfactory single-mode oscillation with a transverse mode suppression ratio of 50 dB or more was obtained. No deterioration was observed in the oscillation spectrum at this time due to residual reflection in the vicinity of the BJ integrated region, or discontinuity of the diffraction grating phase or connection failure of the diffraction grating layer. Thus, a low-threshold BH-type DR laser was able to be manufactured with a good yield.

[Optical Transceiver Module]

Figure 7:
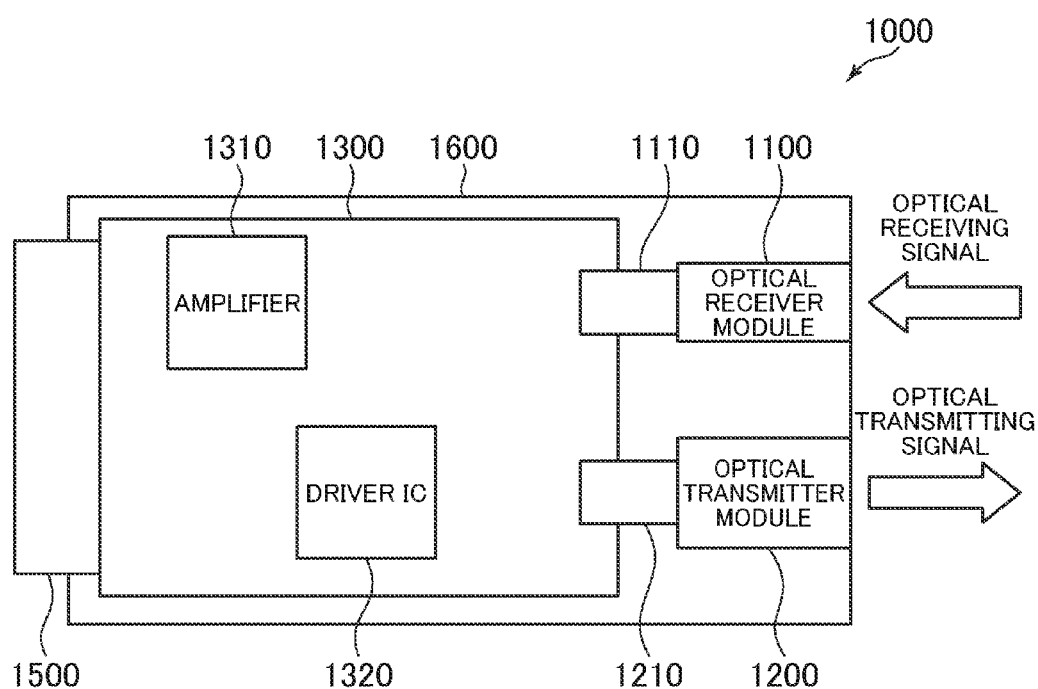
FIG. 7 is a configuration diagram of an optical module having mounted thereon the DR laser according to the embodiments of the present invention.

Next, with reference to FIG. 7, a configuration example of an optical transceiver module (optical module) having mounted thereon the DR laser according to the embodiments of the present invention is described. Note that, the DR laser to be mounted on the optical transceiver module is not limited to those of the first to fifth embodiments described above as long as a semiconductor optical integrated device applying the present invention is employed.

As illustrated in FIG. 7, an optical transceiver module 1000 includes an optical transmitter module 1200 incorporating the upper diffraction grating DR laser, and an optical receiver module 1100 configured to receive an optical receiving signal from the outside. Further, the optical receiver module 1100 and the optical transmitter module 1200 are connected to a printed board (main board) 1300 with flexible boards 1110 and 1210, respectively, to thereby exchange electrical signals. Further, on the printed board 1300, a driver IC 1320 connected to the optical transmitter module 1200 and an amplifier 1310 connected to the optical receiver module 1100 are mounted, and the printed board 1300 is further electrically connected to the outside with an external interface 1500, to thereby form a driving circuit. Further, the optical receiver module 1100, the optical transmitter module 1200, the printed board 1300, and the like are housed in a casing 1600.

An electrical transmitting signal input from the external interface 1500 is amplified by the driver IC 1320, and passes through the flexible board 1210 to be transmitted to the upper diffraction grating DR laser inside the optical transmitter module 1200. The upper diffraction grating DR laser converts the electrical transmitting signal into an optical transmitting signal, which is oscillated to the outside. The optical transceiver module 1000 includes the high-yield upper diffraction grating DR laser of the invention of this application, and hence the optical transceiver module 1000 can be realized at low cost.

Further, in this case, the optical transceiver module 1000 having both of a transmitting function and a receiving function is described, but the optical module may only have the transmitting function. The semiconductor optical integrated devices according to the present invention are not limited to the DR lasers according to the first to fifth embodiments described above. In particular the semiconductor integrated optical devices according to the present invention are not limited to the DR laser according to the third embodiment. In the third embodiment, the semiconductor integrated optical device has the same structure of the second embodiment in the DFB laser region and the mirror region(s), however, the semiconductor integrated optical device may have the same structure of any of the first, fourth, and fifth embodiments, or the like.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor integrated optical device, which is configured such that, on a semiconductor substrate, a first semiconductor optical element comprising an active layer configured to generate light and a second semiconductor optical element comprising a waveguide layer configured to guide the light generated in the active layer are butt-jointed to each other with optical axes of the first semiconductor optical element and the second semiconductor optical element being aligned with each other, the semiconductor integrated optical device comprising:
    a semiconductor regrowth layer comprising at least one of a diffraction grating layer and an etching stop layer, which is formed by one epitaxial growth across an entire surface above the active layer and the waveguide layer;
    a cladding layer formed above the semiconductor regrowth layer; and
    a side wall-shaped control layer formed at a connection interface between the active layer and the waveguide layer butt-jointed with the optical axes thereof being aligned with each other.

2. The semiconductor integrated optical device according to claim 1, wherein the semiconductor regrowth layer comprises an etching stop layer used when the cladding layer is subjected to chemical etching with use of a predetermined etching solution.

3. The semiconductor integrated optical device according to claim 1,
    wherein the semiconductor regrowth layer is made of a common semiconductor material with the cladding layer, and
    wherein the semiconductor regrowth layer comprises:
        a spacer layer made of a semiconductor material different in doping ion concentration from the cladding layer; and
        a diffraction grating layer formed on the spacer layer, in which a diffraction grating having a predetermined pitch is formed along an optical axis direction of the light.

4. The semiconductor integrated optical device according to claim 3,
    wherein the semiconductor regrowth layer further comprises an etching stop layer used when the cladding layer is subjected to chemical etching with use of a predetermined etching solution,
    wherein the spacer layer is formed on the etching stop layer, and
    wherein the diffraction grating layer is formed on the spacer layer.

5. The semiconductor integrated optical device according to claim 1,
    wherein the semiconductor regrowth layer further comprises a buffer layer made of a common semiconductor material with the cladding layer in a different doping ion concentration from the cladding layer, and
    wherein the buffer layer is formed above the active layer and the waveguide layer.

6. The semiconductor integrated optical device according to claim 1,
    wherein the active layer contains aluminum,
    wherein the semiconductor integrated optical device further comprises a phosphorous spacer layer containing phosphorus, which is formed on the active layer, and
    wherein the phosphorous spacer layer is formed into an eave shape that covers the active layer and extends from an end portion of the semiconductor integrated optical device on an opposite side to the connection interface to reach a region above the side wall-shaped control layer.

7. The semiconductor integrated optical device according to claim 1,
wherein the first semiconductor optical element comprises a distributed feedback semiconductor laser, and
wherein the second semiconductor optical element comprises a distributed Bragg reflector mirror.

8. The semiconductor integrated optical device according to claim 1, further comprising a third semiconductor optical element configured to be butt-jointed to the first semiconductor optical element on an opposite side to the second semiconductor optical element with optical axes of the third semiconductor optical element and the first semiconductor optical element being aligned with each other,
wherein the third semiconductor optical element comprises a waveguide layer configured to guide the light generated in the active layer, and
wherein the semiconductor regrowth layer comprises at least one of a diffraction grating layer or an etching stop layer, which is formed by one epitaxial growth across an entire surface above the active layer, the waveguide layer of the second semiconductor optical element, and the waveguide layer of the third semiconductor optical element.

9. The semiconductor integrated optical device according to claim 8,
wherein the third semiconductor optical element comprises a distributed Bragg reflector mirror.

10. The semiconductor integrated optical device according to claim 1, further comprising:
a reflecting mirror configured to reflect the light generated from the active layer toward a surface of the semiconductor substrate, the reflecting mirror being formed at a light emitting end; and
a lens configured to collect light reflected by the reflecting mirror, the lens being formed on the surface of the semiconductor substrate at a position from which the light is emitted.

11. A method of manufacturing a semiconductor integrated optical device configured such that, on a semiconductor substrate, a first semiconductor optical element and a second semiconductor optical element are butt-jointed to each other with optical axes of the first semiconductor optical element and the second semiconductor optical element being aligned with each other, the method comprising:
forming, in the first semiconductor optical element, an active layer configured to generate light;
forming, in the second semiconductor optical element, a waveguide layer configured to guide the light generated in the active layer;
forming one of a diffraction grating layer and an etching stop layer by one epitaxial growth across an entire surface above the active layer and the waveguide layer;
forming a cladding layer above a semiconductor regrowth layer including the one of the diffraction grating layer and the etching stop layer; and
forming a side wall-shaped control layer formed at a connection interface between the active layer and the waveguide layer butt-jointed with the optical axes thereof being aligned with each other.

12. The method of manufacturing a semiconductor integrated optical device according to claim 11, further comprising:
sequentially laminating and forming an etching stop layer used when the cladding layer is subjected to chemical etching with use of a predetermined etching solution, a spacer layer made of a common semiconductor material with the cladding layer in a different doping ion concentration from the cladding layer, and a diffraction grating layer; and
forming, in the diffraction grating layer, a diffraction grating having a predetermined pitch along an optical axis direction.

13. The method of manufacturing a semiconductor integrated optical device according to claim 11, further comprising forming, on an opposite side to the second semiconductor optical element, a third semiconductor optical element comprising a waveguide layer configured to guide the light generated in the active layer and being butt-jointed to the first semiconductor optical element with optical axes of the third semiconductor optical element and the first semiconductor optical element being aligned with each other,
wherein the forming one of a diffraction grating layer and an etching stop layer by one epitaxial growth comprises forming the one of the diffraction grating layer and the etching stop layer by one epitaxial growth across an entire surface above the active layer, the waveguide layer of the second semiconductor optical element, and the waveguide layer of the third semiconductor optical element.

14. The method of manufacturing a semiconductor integrated optical device according to claim 11, further comprising:
forming the side wall-shaped control layer in contact with a side wall of the active layer and a side wall of the waveguide layer at a connection interface between the active layer and the waveguide layer by changing a shape of the semiconductor substrate by a mass transport phenomenon; and
forming a phosphorous spacer layer containing phosphorus immediately above the active layer,
wherein the active layer contains aluminum, and
wherein the phosphorous spacer layer is formed into an eave shape that covers the active layer and extends from an end portion of the semiconductor integrated optical device on an opposite side to the connection interface to reach a region above the side wall-shaped control layer.

15. An optical module, comprising:
a semiconductor integrated optical device configured such that, on a semiconductor substrate, a first semiconductor optical element comprising an active layer configured to generate light and a second semiconductor optical element comprising a waveguide layer configured to guide the light generated in the active layer are butt-jointed to each other with optical axes of the first semiconductor optical element and the second semiconductor optical element being aligned with each other, the semiconductor integrated optical device comprising:
a semiconductor regrowth layer comprising at least one of a diffraction grating layer and an etching stop layer, which is formed by one epitaxial growth across an entire surface above the active layer and the waveguide layer; and
a cladding layer formed above the semiconductor regrowth layer;
a driving circuit configured to drive the semiconductor integrated optical device;
a casing configured to house the semiconductor integrated optical device and the driving circuit; and forming a side wall-shaped control layer formed at a connection interface between the active layer and the waveguide layer butt-jointed with the optical axes thereof being aligned with each other.

* * * * *